(12) United States Patent  
Suwa et al.

(10) Patent No.: US 7,745,915 B2  
(45) Date of Patent: Jun. 29, 2010

(54) SEMICONDUCTOR DEVICE

(75) Inventors: Motoo Suwa, Saitama (JP); Hikaru Ikegami, Koganei (JP); Takafumi Betsui, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 643 days.

(21) Appl. No.: 11/360,808

(22) Filed: Feb. 24, 2006

(65) Prior Publication Data

US 2006/0192282 A1  Aug. 31, 2006

(30) Foreign Application Priority Data

Feb. 25, 2005  (JP) .............................. 2005-051556

(51) Int. Cl.  
*H01L 23/02* (2006.01)

(52) U.S. Cl. .................. 257/678; 257/700; 257/784; 257/E23.169

(58) Field of Classification Search ................ 257/700, 257/737–738, 772, 779, 686, 777, E23.169–E23.178, 257/207, 211, 690–691, 773, 778, 781, 784, 257/723, 724

See application file for complete search history.

(56) References Cited

U.S. PATENT DOCUMENTS 6,208,525 B1 * 3/2001 Imasu et al. ................ 361/783

6,812,565 B2  11/2004 Nishimoto et al.  
2005/0204223 A1 * 9/2005 Ong ........................... 714/724

FOREIGN PATENT DOCUMENTS

| CN | 1433252 A | 1/2002 |
| JP | 2002-368188 | 12/2002 |
| JP | 2003-204030 | 7/2003 |

OTHER PUBLICATIONS

Office Action dated Apr. 3, 2009 (in Chinese); English language translation of Office Action.

* cited by examiner

*Primary Examiner*—Hoa B Trinh  
(74) *Attorney, Agent, or Firm*—Antonelli, Terry, Stout & Kraus, LLP.

(57) ABSTRACT

A mounting board has a plurality of semiconductor memory devices operated in sync with a clock signal, and a semiconductor data processing device which access-controls the semiconductor memory devices. Layouts of data-system terminals of the semiconductor memory devices with respect to memory access terminals of the semiconductor data processing device are determined in such a manner that wirings for data and a data strobe system (RTdq/dqs) become shorter than wirings for a command/address system (RTcmd/add). The wirings for the data and data strobe system (RTdq/dqs) are laid down using an area defined between the semiconductor memory devices. The wirings for the command/address system (RTcmd/add) bypass the side of the mounting board.

12 Claims, 24 Drawing Sheets

SEMICONDUCTOR DEVICE

CROSS-REFERENCE TO RELATED APPLICATION

The present application claims priority from Japanese patent application No. 2005-051556 filed on Feb. 25, 2005, the content of which is hereby incorporated by reference into this application.

BACKGROUND OF THE INVENTION

The present invention relates to a semiconductor device packaged by implementing a plurality of semiconductor devices in a mounting board, and to, for example, a technique effective if applied to a semiconductor device configured as a multichip module or SIP (System in Package) in which a synchronous DRAM (SDRAM) chip having a double data rate (DDR) based on the JEDEC standard (JESD79) and a microcomputer chip are mounted.

External data terminals of plural bits in an SDRAM are configured in such a manner that their data input/output timings are synchronized with a clock signal. A microcomputer fetches therein data outputted from the SDRAM in sync with the clock signal (data strobe signal: DQS) outputted from the SDRAM. As data input/output rates of the SDRAM, there are known a single data rate, and a double data rate equivalent to twice the single data rate. The single data rate inputs and outputs data in cycle units of the data strobe signal, whereas the double data rate inputs and outputs data in sync with the falling and rising edges of the data strobe signal. Thus, a timing margin is reduced in the double data rate as compared with the single data rate. Achieving an improvement in signal integrity (SI) with respect to in-module wirings connected to data input/output data terminals (DQ) doubled in transfer rate and data strobe terminals (DQS) for the input/output of the data strobe signal therefore needs to prevent malfunctions in particular.

Although attention is not directed toward the improvement in the signal integrity, a semiconductor device in which a microprocessor and a DDR-SDRAM are mounted onto one printed circuit board or mounting board has been described in a patent document 1 (Japanese Unexamined Patent Publication No. 2003-204030).

SUMMARY OF THE INVENTION

The present inventors have discussed an improvement in signal integrity in a semiconductor device scaled down in package size. In order to enhance signal quality, a method can be adopted in which wiring impedance is matched with output impedance of a driver to thereby reduce a reflected wave (termination of transmitting end), or a resistor matched with wiring impedance is connected to the receiver side to reduce a reflected wave (termination of receiving end). Since the wiring impedance is lower than the output impedance of the driver, a resistor (series resistor) is generally added to the neighborhood of the driver to perform termination of the transmitting end, thereby making it possible to achieve impedance matching and reduce the reflected wave.

In a semiconductor device of a multichip module form like an SIP, however, the packaging area of a built-in semiconductor device is small. It is therefore difficult to dispose the series resistor for termination of the transmitting end over a mounting board or substrate in conjunction with each other. On the other hand, the use of ½Vccq (Vccq: DDR interface power supply voltage) as a terminating potential is defined as being standard in a DDR interface where the receiving end is terminated. To this end, there is a need to mount or implement a regulator, an inductor and a capacitor for generating a terminating power supply having relatively large current supply capacity in a motherboard. Those parts are large in size, thus leading to size enlargement of the whole system. Since a DC current also continues to flow through their circuits, current consumption and heat generation increase. From these viewpoints, the present inventors have demonstrated the utility of avoiding processing at the terminations of the transmitting and receiving ends with respect to each signal wiring in the built-in device in order to enhance signal quality at the semiconductor device of the SIP form equipped with the semiconductor device such as DDR-SDRAM.

An object of the present invention is to enhance signal quality in a semiconductor device in which a plurality of semiconductor devices are mounted onto a mounting board.

Another object of the present invention is to reduce wiring impedance and short-wiring in a semiconductor device in which a plurality of semiconductor devices are mounted onto a mounting board.

A further object of the present invention is to provide a semiconductor device in which a plurality of semiconductor devices are mounted onto a mounting board, which is capable of enhancing signal quality in avoidance of both mounting of a resistor for termination of a transmitting end and application of a terminating potential for termination of a receiving end in the semiconductor device.

The above, other objects and novel features of the present invention will become apparent from the description of the specification and the accompanying drawings.

Summaries of representative ones of the inventions disclosed in the present application will be explained briefly as follows:

[1] <<Data-System Terminals of Semiconductor Memory Devices with Respect to Semiconductor Data Processing Device>>

A typical one semiconductor device (1) of the present invention has a plurality of semiconductor devices (3 through 5) mounted over one surface of a semiconductor mounting board or substrate (2). The mounting board has a plurality of substrate terminals (12) formed in other surface thereof, and wiring layers (L1 through L6) for connecting the substrate terminals to the semiconductor devices. The semiconductor devices respectively have a plurality of device terminals (10, 11) connected to the wiring layers of the mounting board. The semiconductor devices include a plurality of semiconductor memory devices (4, 5) operated in sync with a clock signal and a semiconductor data processing device (3) for access-controlling the plurality of semiconductor memory devices, as the plurality of semiconductor devices. Each of the semiconductor memory devices includes, as the device terminals (11), data input/output terminals (DQ0 through DQ15), data strobe terminals (UDQS, LDQS), address input terminals (A0 through A13) and clock input terminals (CK, /CK). The semiconductor memory devices are disposed over the mounting board in such a manner that the data input/output terminals and the data strobe terminals are placed closer to the semiconductor data processing device than the address input terminals. From the above, wirings (30 through 33) for connecting the data input/output terminals and data strobe terminals of the semiconductor memory devices to their corresponding device terminals of the semiconductor data processing device are short-wired and thereby signal quality is improved.

As one typical specific form of the present invention, each of the semiconductor memory devices has a structure in which a synchronous DRAM chip having a double data rate is accommodated in a package having a terminal array based on the JEDEC standard. The semiconductor data processing device has a structure in which a microcomputer chip is held in a chip size package. Since the synchronous DRAM chip having the double data rate is strict in timing margin of a data system as compared with a single data rate, an improvement in signal quality is essential to malfunction prevention. Each semiconductor memory device of the package having the terminal array based on the JEDEC standard is adopted without using a bare chip. Therefore, even though any of semiconductor memory devices different in terminal array of the bare chip depending on semiconductor manufacturers is adopted, there is no need to modify wiring layouts or the like on the mounting board on an as-needed basis in terms of the terminal array. In general, the semiconductor data processing device is custom-made whereas the semiconductor memory devices are often products for general purpose use. Thus, its supply makers span a wide range.

[2] <<Layout of Data-System Wirings for Semiconductor Memory Devices>>

As one typical specific form of the present invention, the wiring layer of the mounting board has strobe signal wirings (32, 33) formed using areas among the mounted plural semiconductor memory devices. The strobe signal wirings are wirings for connecting the data strobe terminals of the plural semiconductor memory devices to their corresponding terminals of the semiconductor data processing device. Intensively laying out the strobe signal wirings among the mounted plural semiconductor memory devices makes it easy to separate the strobe signal wirings from other signal wirings. Therefore, a reduction in crosstalk in other signal becomes easy. In this respect, signal quality is improved.

As another typical specific form of the present invention, data strobe signal wirings are separated from data signal wirings (30, 31). The data signal wirings are signal wirings for connecting the data input/output terminals of the plural semiconductor memory devices to their corresponding terminals of the semiconductor data processing device. Since a data strobe signal is a timing signal for defining a data fetching timing or the like, distorting of a data strobe signal waveform due to a change in data can easily be suppressed by separation of the data signal wirings and the data strobe signal wirings from one another. Even though the semiconductor data processing device outputs write data of plural bits in, for example, a DDR-SDRAM after the rising edge of the data strobe signal has been changed, the data strobe signal becomes hard to be affected by crosstalk noise and coupling noise even between the data strobe signal and each data signal. In this respect, signal quality is improved.

[3] <<Layout of Clock Wirings for Semiconductor Memory Devices>>

As a further typical specific form of the present invention, the wiring layer of the mounting board has a clock signal wiring (34) formed using areas among the mounted plural semiconductor memory devices. The clock signal wiring is a wiring for connecting clock terminals of the plural semiconductor memory devices to their corresponding terminals of the semiconductor data processing device. And the clock signal wiring has branches or stubs (35, 36) in midstream with the semiconductor data processing device as a base point and form length-equalization paths extending to the respective semiconductor memory devices. Intensively laying out the clock signal wiring among the mounted plural semiconductor memory devices makes it easy to separate the clock signal wiring from other signal wirings. Therefore, it becomes easy to reduce crosstalk in other signal. Further, since the semiconductor memory devices are placed on both sides of the clock signal wiring, the length equalization of the clock wirings employed in the synchronous operations of the semiconductor memory devices becomes easy. Even in this respect, signal equality is improved.

As a still further specific form, the clock signal wiring is disposed separately from the data signal wirings and the strobe signal wirings. The influence of crosstalk noise and coupling noise between the data signal wirings and the strobe signal wirings can also be reduced.

As a still further specific form, the clock signal wiring (CKL) is configured by a differential pair. A noise-resistance characteristic is improved by virtue of canceling action of in-phase noise.

As a still further specific form, the clock signal wiring has a pair of substrate terminals (12A and 12B) for connection of a differential terminating resistor (37) connected to the stubs of the clock signal wiring, as the substrate terminals (12). Signal quality is always required for a differential clock beyond other signals. In consideration of it, termination processing is adopted for the clock wirings for the differential clock.

At this time, the pair of substrate terminals for the connection of the differential terminating resistor may preferably be disposed adjacent to each other. Length equalization and short-wiring relative to the clock wiring paths for differential termination also become easy.

[4] <<Allocation of Major Signal Wirings at Multilayer Wiring Board>>

As a still further specific form, the mounting board has a core layer (8) and buildup layers (9, 16) formed in front and back surfaces thereof. The core layer has a layer (L4) for forming a power plane and a layer (L3) for forming a ground plane, both formed in the front and back surfaces thereof. Major signal wirings for connecting the semiconductor memory devices and the semiconductor data processing device are formed using the wiring layers (L1, L2) for the buildup layer on the implemented side of the semiconductor devices with respect to the core layer. Signal wirings for connecting the stubs to the corresponding substrate terminals for connection of the differential terminating resistor are formed using the wiring layers (L5, L6) for the buildup layer on the formed side of the substrate terminals with respect to the core layer. Routing lengths of the signal wirings for connecting the semiconductor memory devices and the semiconductor data processing device become short. This contributes to a reduction in wiring impedance and short-wiring.

[5] <<Layout of Power Supply Terminals in Consideration of Power Plane Structure of Motherboard>>

As one typical specific form of the present invention, the semiconductor device includes, as the substrate terminals, core power supply terminals (12cor) for supplying a core-circuit power supply to the semiconductor data processing device, interface power supply terminals (12io) for supplying an external interface power supply to the semiconductor data processing device, memory power supply terminals (12ddr) for supplying a memory power supply to the semiconductor data processing device and the semiconductor memory devices, and ground terminals (12gnd). The core power supply terminals are disposed close to the semiconductor data processing device. The memory power supply terminals are disposed close to the semiconductor memory devices. The interface power supply terminals are dispersed around the mounting board together with signal terminals and ground terminals.

Although the signal terminals are unavoidably dispersively disposed because they are large in number, the interface power supply terminals may preferably be disposed together with the signal terminals and ground terminals in terms of a reduction in parasitic inductance of each signal path. If, at this time, the core power supply terminals are disposed close to the semiconductor data processing device, and the memory power supply terminals are placed close to the semiconductor memory devices, then an interface power plane is divided into two at minimum in the motherboard with the semiconductor device mounted thereon and can be formed so as to surround a core power plane and a memory power plane, even if the substrate terminals are used for a ball grid array in which they are disposed so as to turn around in plural rows. The leading out of power to the respective core and memory power planes may use an area defined between the divided interface power planes.

[6] <<Customization of Memory Power Supply Terminals in Semiconductor Memory Devices and Semiconductor Data Processing Device>>

As another specific form, a first memory power supply terminal (12ddr_ram) for supplying a first memory power supply used for memory operations of the semiconductor memory devices to the semiconductor memory devices, and a second memory power supply terminal (12ddr_mcu) for supplying a second memory power supply used for interface control on the semiconductor memory devices to the semiconductor data processing device may be provided separately. This is because the memory power supply can reliably be divided when consideration is made in such a manner that the semiconductor memory devices can be tested singly from the semiconductor data processing device before the semiconductor device is mounted onto the motherboard. In brief, when the semiconductor memory devices are tested singly, such a configuration that the output of the corresponding memory interface circuit section is not brought to a high output impedance state even though the semiconductor data processing device is placed in a standby state or a not-ready state, is taken into consideration.

The first memory power supply terminal and the second memory power supply terminal are connected to a common power supply wiring or power plane on the motherboard in a state of being mounted onto the motherboard.

As a further specific form, the mounting board has a first memory power plane (73) connected to the first memory power supply terminal and a second memory power plane (70) connected to the second memory power supply terminal separately. The first memory power plane and the second memory power plane are formed in the wiring layers (L5, L4) corresponding to layers different from each other and have layouts which overlap at the adjacent layers of the mounting board. When a signal is charged and discharged between the semiconductor data processing device and the semiconductor memory devices where the first memory power supply terminal and the second memory power supply terminal are being separated from each other, a path for a feedback current flowing through the corresponding power supply wiring, of its charge and discharge currents is partitioned by the first memory power supply terminal and the second memory power supply terminal on the semiconductor device, and the current must be fed back via the corresponding power supply wiring or power plane on the motherboard, thus resulting in an increase in the impedance of a power system. There is provided one means for suppressing it to the utmost, which is to separately form the first memory power plane connected to the first memory power supply terminal and the second memory power plane connected to the second memory power supply terminal and superimpose them on each other. Since a current that flows through the first memory power plane and a current that flows through the second memory power plane with the input/output of each signal between the semiconductor data processing device and the semiconductor memory devices become opposite in direction, the effective inductance of the power system can be reduced by allowing both power planes to be coupled to each other.

As a still further specific form, the first memory power supply terminal and the second memory power supply terminal may preferably be disposed adjacent to each other. Thus, a power-system path on the motherboard, for connecting the first memory power supply terminal and the second memory power supply terminal can be shortened. Even in this respect, the inductance of the power system can be reduced.

As a still further specific form, the second memory power plane has a layout superimposed, as viewed in the front/back surface direction of the mounting board, over signal wirings (30 through 34) for connecting the data input/output terminals, data strobe terminals and clock input terminals of the semiconductor memory devices, and the device terminals corresponding to those terminals, of the semiconductor data processing device. Thus, the signal wirings necessary for memory control, of the semiconductor data processing device, and the circuit's power plane necessary for memory control are coupled and hence the effective inductance at the second memory power plane can be reduced. Since the operating frequencies for data and a strobe signal are high in the case of a DDR-SDRAM in particular, a reduction in effective inductance is important.

As a still further specific form, the mounting board has a core layer and buildup layers formed in front and back surfaces thereof. Signal wirings for connecting the semiconductor memory devices and the semiconductor data processing device are formed using the wiring layers (L2, L1) for the buildup layer on the implemented side of the semiconductor devices with respect to the core layer. The core layer has a power plane and a ground plane formed in separate layers as viewed in its front/back direction. The second power plane is formed in part of a layer (L4) for forming the power plane of the core layer. The first power plane is formed using the wiring layer (L5) for the buildup layer adjacent to the power plane forming layer as viewed in its front/back surface direction. It is possible to allow the corresponding signal wiring necessary for the memory control of the semiconductor data processing device and the circuit's power plane necessary for the memory control to be sufficiently coupled to each other.

[7] <<Improvement in Signal Quality for Reference Potential>>

As a still further specific form of the present invention, the semiconductor device includes, as the substrate terminals, a first reference potential terminal (12vref1, 12vref2) for supplying a reference potential to the semiconductor memory devices, and a second reference potential terminal (12vref) for supplying a reference potential to the semiconductor data processing device, separately. The mounting board has a memory power plane (70) connected to the memory power supply terminals. The first reference potential terminal and the second reference potential terminal have layouts superimposed over the memory power plane as viewed in the front/back surface direction of the mounting board. Customizing the first reference potential terminal and the second reference potential terminal makes it possible to shorten routing of the reference potential wirings inside the semiconductor device. In the specs of each DDR-SDRAM, the first and second reference potentials are respectively defined so as to have a level equal to one-half the memory power supply. Thus, each first reference potential terminal and the second reference potential terminal are coupled to the memory power plane so that both reference potentials become hard to fluctuate or swing in level with respect to the memory power supply.

As a still further specific form of the present invention, the first reference potential terminals and the second reference potential terminal are disposed adjacent to the memory power supply terminals (12ddr_ram, 12ddr_mcu) and the ground terminals (12gnd). Thus, since coupling among each signal, power and ground can be obtained, this can contribute to suppression of unwanted fluctuations in reference potential.

As a still further specific form of the present invention, the substrate terminals have layouts in which plural rows are concentrically turned around. At this time, the first reference potential terminals and the second reference potential terminal are placed in an innermost periphery of a turned-around disposed substrate terminal array. Assuming that the interface power supply terminals are dispersed around together with the signal terminals and the memory power supply terminals are disposed close to the semiconductor memory devices, the coupling among the signal, power and ground is easy to obtain.

Resistive elements and capacitors for cutting RF noise are implemented onto the motherboard, and the memory power supply may be divided by their resistances to form the reference potentials.

[8] <<Suppression of Power Noise at PLL Circuit or DLL Circuit>>

As a still further specific form of the present invention, the semiconductor data processing device has a PLL (Phase-Locked Loop) circuit or a DLL (Delay-Locked Loop) circuit and has power supply device terminals (10dllvcc) and ground device terminals (10dllgnd) dedicated to the PLL circuit or DLL circuit as its device terminals. The mounting board has substrate power supply terminals (12dllvcc) and substrate ground terminals (12dllgnd) dedicated to the PLL circuit or DLL circuit as substrate terminals. Within a plane vertical to the front/back surface direction of the mounting board, the power supply substrate terminals are positioned in the neighborhood of the power supply device terminals, and the ground substrate terminals are positioned in the neighborhood of the ground device terminals. From the above, power-system and ground-system wirings dedicated to the PLL circuit or DLL circuit in the semiconductor device can be made the shortest. Currents that have flown from the dedicated power supply terminals to the PLL circuit or DLL circuit are fed back to their corresponding dedicated ground terminals. Therefore, if the power-system and ground-system wirings are rendered the shortest as described above, then the area of a loop that goes through the power and ground wirings dedicated to the PLL circuit or DLL circuit becomes small and hence noise becomes hard to enter into the power system dedicated to the PLL circuit or DLL circuit. It is possible to prevent the fear of a malfunction of the PLL circuit or DLL circuit whose circuit characteristic is susceptible to power noise, before it happens.

As a still further specific form, the power supply substrate terminals and the ground substrate terminals are made adjacent to one another. Thus, the pairs of the power and ground wirings dedicated to the PLL circuit or DLL circuit can easily be formed and resistance to crosstalk noise is also improved.

[9] <<Layout of Testing Substrate Terminals>>

As a further typical specific form of the present invention, the substrate terminals include a turned-around terminal group in which plural rows are concentrically turned around, and a central terminal group surrounded by the turned-around terminal group. The test-dedicated terminals connected to the corresponding device terminals (100 through 105) of the semiconductor memory devices are allocated to part of the central terminal group and part of terminals on the inner periphery side of the turned-around terminal group. Wiring patterns on the motherboard are formed so as to match with the array of the substrate terminals of the semiconductor device. Accordingly, the wiring patterns connected to the inner side of the turned-around terminal group and the central terminal group must be extended in avoidance of the wiring patterns connected to the outside of the turned-around terminal group. Thus, the assignment of the test-dedicated terminals to the inner side of the turned-around terminal group and the central terminal group can contribute to the simplification of a mounting wiring structure on the motherboard.

[10] <<Customization of Device Terminals for Clock Enable Signal>>

As a still further specific form, an input terminal (12ckei) for a clock enable signal for indicating the validity of a signal inputted to the clock input terminal is provided as the device terminal of each of the semiconductor memory devices. An output terminal (12ckeo) for outputting the clock enable signal is provided as the device terminal of the semiconductor data processing device. A terminal connected to the input terminal for the clock enable signal and a terminal connected to the output terminal for the clock enable signal are provided separately as the substrate terminals. Thus, when the semiconductor device is device-tested before its mounting onto the motherboard, the clock enable signal is set to a disenable level to thereby bring each semiconductor memory device to standby state or a not-ready state arbitrarily, whereby the semiconductor data processing device can be tested singly.

As a still further specific form, the substrate terminal connected to the input terminal for the clock enable signal, and the substrate terminal connected to the output terminal for the clock enable signal are disposed adjacent to each other. It becomes easy to connect the input/output terminals for the clock enable signal, which are separated from each other for testing, on the motherboard.

[11] Another typical semiconductor device of the present invention has a mounting substrate or board and a plurality of semiconductor devices mounted over one surface of the mounting board. The mounting board has a plurality of substrate terminals formed in other surface thereof and wiring layers for connecting the substrate terminals to the semiconductor devices. The semiconductor devices respectively have a plurality of device terminals connected to the wiring layers of the mounting board. The semiconductor devices include a plurality of semiconductor memory devices operated in sync with a clock signal and a semiconductor data processing device for access-controlling the plurality of semiconductor memory devices, as the plurality of semiconductor devices. Core power supply terminals for supplying a core-circuit power supply to the semiconductor data processing device, interface power supply terminals for supplying an external interface power supply to the semiconductor data processing device, memory power supply terminals for supplying a memory power supply to the semiconductor data processing device and the semiconductor memory devices, and ground terminals are provided as the substrate terminals. The core power supply terminals are disposed close to the semiconductor data processing device, the memory power supply terminals are disposed close to the semiconductor memory devices, and the interface power supply terminals are dispersed around the mounting board together with signal terminals.

[12] A further typical semiconductor device of the present invention has a mounting board or substrate, and a plurality of semiconductor devices mounted over one surface of the mounting board. The mounting board has a plurality of substrate terminals formed in other surface thereof and wiring layers for connecting the substrate terminals to the semiconductor devices. The semiconductor devices respectively have a plurality of device terminals connected to the wiring layers of the mounting board. The semiconductor devices include a plurality of semiconductor memory devices operated in sync with a clock signal and a semiconductor data processing device for access-controlling the plurality of semiconductor memory devices, as the plurality of semiconductor devices. Memory power supply terminals for supplying a memory power supply to the semiconductor data processing device and the semiconductor memory devices, ground terminals, a first reference potential terminal for supplying a reference potential to the semiconductor memory devices, and a second reference potential terminal for supplying a reference potential to the semiconductor data processing device are provided as the substrate terminals. The mounting board has a memory power plane connected to the memory power supply terminals. The first reference potential terminal and the second reference potential terminal have layouts superimposed over the memory power plane as viewed in the direction of front and back surfaces of the mounting board.

[13] A still further typical semiconductor device of the present invention has a mounting board or substrate, and a plurality of semiconductor devices mounted over one surface of the mounting board. The mounting board has a plurality of substrate terminals formed in other surface thereof and wiring layers for connecting the substrate terminals to the semiconductor devices. The semiconductor devices respectively have a plurality of device terminals connected to the wiring layers of the mounting board. The semiconductor devices include a plurality of semiconductor memory devices operated in sync with a clock signal and a semiconductor data processing device for access-controlling the plurality of semiconductor memory devices, as the plurality of semiconductor devices. The semiconductor data processing device has a PLL circuit or a DLL circuit and has power supply device terminals and ground device terminals dedicated to the PLL circuit or DLL circuit as its device terminals. The mounting board has substrate power supply terminals and substrate ground terminals dedicated to the PLL circuit or DLL circuit as substrate terminals. Within a plane vertical to the front/back surface direction of the mounting board, the power supply substrate terminals are positioned in the neighborhood of the power supply device terminals, and the ground substrate terminals are positioned in the neighborhood of the ground device terminals.

Advantageous effects obtained by a representative one of the inventions disclosed in the present application will briefly be described as follows:

That is, it is possible to enhance signal quality at a semiconductor device in which a plurality of semiconductor devices are mounted onto a mounting board.

It is also possible to reduce wiring impedance and short-wiring at a semiconductor device in which a plurality of semiconductor devices are mounted onto a mounting board.

It is further possible to enhance signal quality in avoidance of both mounting of a resistor for termination of a transmitting end and application of a terminating potential for termination of a receiving end in a semiconductor device in which a plurality of semiconductor device are mounted onto a mounting board.

DETAILED DESCRIPTION OF THE PREFERRED EMBODIMENTS

Vertical Sectional Structure of Semiconductor Device

Figure 1:
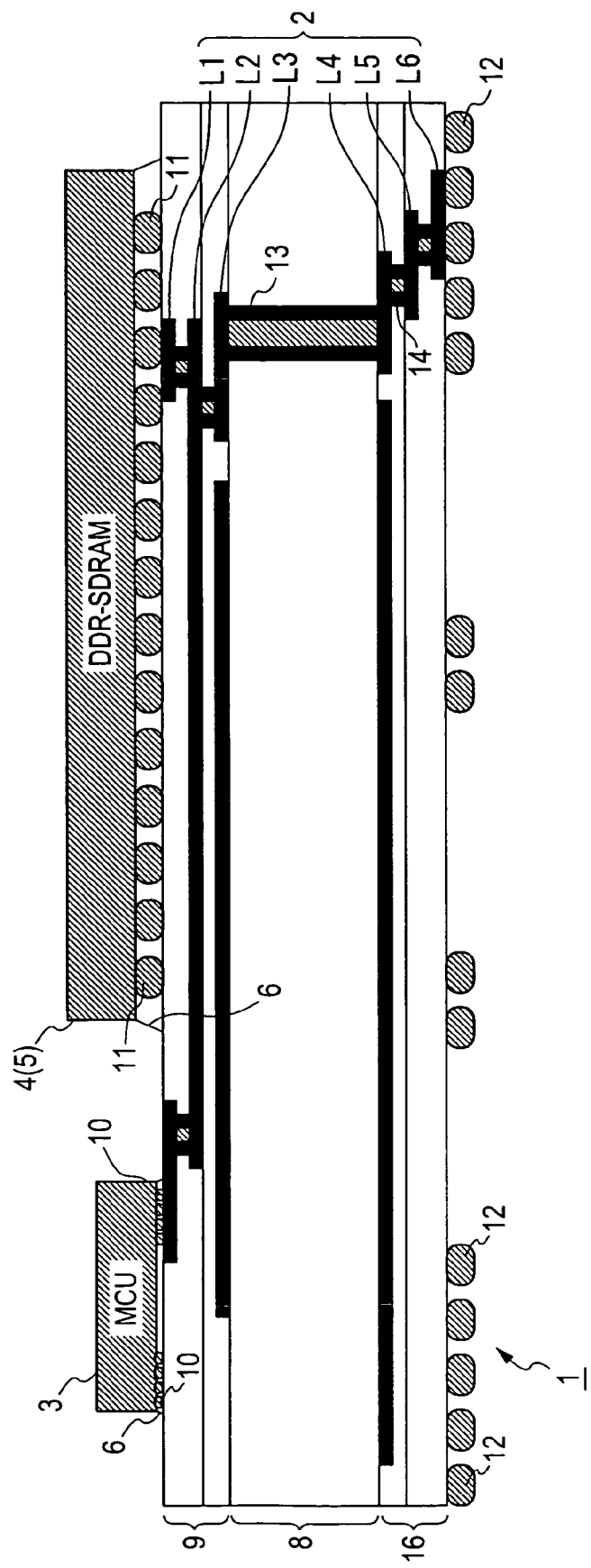
FIG. 1 is a cross-sectional view illustrating a vertical sectional structure of a semiconductor device according to the present invention.

A vertical cross-sectional view of a semiconductor device according to the present invention is illustrated in FIG. 1. The semiconductor device 1 includes one microcomputer (MCU) 3 configured as a semiconductor data processing device and two DDR-SDRAMs 4 (5) configured as plural semiconductor memory devices both of which are provided over one surface of a mounting board or printed circuit board 2. The microcomputer (MCU) 3 and the two DDR-SDRAMs 4 (5) are configured such that gaps or spaces defined between the two and the mounting board 2 are filled with an underfill resin 6. The present semiconductor device is defined as a multichip module of a system-in-package.

The MCU 3 is implemented facedown onto a package substrate. The DDR-SDRAMs 4(5) are configured in such a manner that a DDR-SDRAM chip is encapsulated in a package of a ball grid array having a terminal array based on the JEDEC standard (JESD79). Since the DDR-SDRAM of a package having the terminal array based on the JEDEC standard is adopted without using a bare chip, the external terminal array of the package always meets the JEDEC standard even though any of SDRAMs different in terminal array of a bare chip depending on semiconductor manufacturers is adopted. Therefore, there is no need to modify wiring layouts or the like on the mounting board on an as-needed basis in terms of the terminal array. In general, the MCU is custom-made whereas the DDR-SDRAM is often a product for general purpose use. Thus, its supply makers span a wide range.

The printed circuit board 2 has a core layer 8 and buildup layers 9 and 16 formed on its obverse and reverse sides and is configured as a multilayered wiring resin substrate. The core layer 8 has a thickness of, for example, 0.8 mm or so. The buildup layer 9 has a thickness ranging from about 30 to 40 μm, for example. Wiring layers L3, L2 and L1 are formed from the core layer 8 side. The buildup layer 16 has a thickness ranging from about 30 to 40 μm, for example. Wiring layers L4, L5 and L6 are formed from the core layer 8 side. The wiring layers L1 and L2 are principally used to form wirings for connecting device bump electrodes 10 of the MCU 3 and device bump electrodes 11 of the DDR-SDRAMs 4(5). The wiring layer L3 is principally used to form a ground plane. The wiring layer L4 is principally used to form a power plane. The wiring layers L5 and L6 are used to form wirings for connecting the signal wirings, ground plane and power plane formed in the wiring layers L1 through L4 to substrate bump electrodes 12 used as external connecting terminals of the printed circuit board. The device bump electrodes 10 and 11 are examples of device terminals for the semiconductor devices, and the substrate bump electrodes 12 are examples of substrate terminals for the printed circuit board 2. In the figure, reference numeral 13 indicates a typically-illustrated through hole, which extends through the core layer 8. Reference numerals 14 indicate vias. Conductive sections or portions obtained by giving the inner faces of via holes or through holes conductive plating are generically called vias. They make their upper and lower wiring layers or metal patterns conductive to one another.

<<Arrangement of Device Terminals for Data System>>

Figure 2:
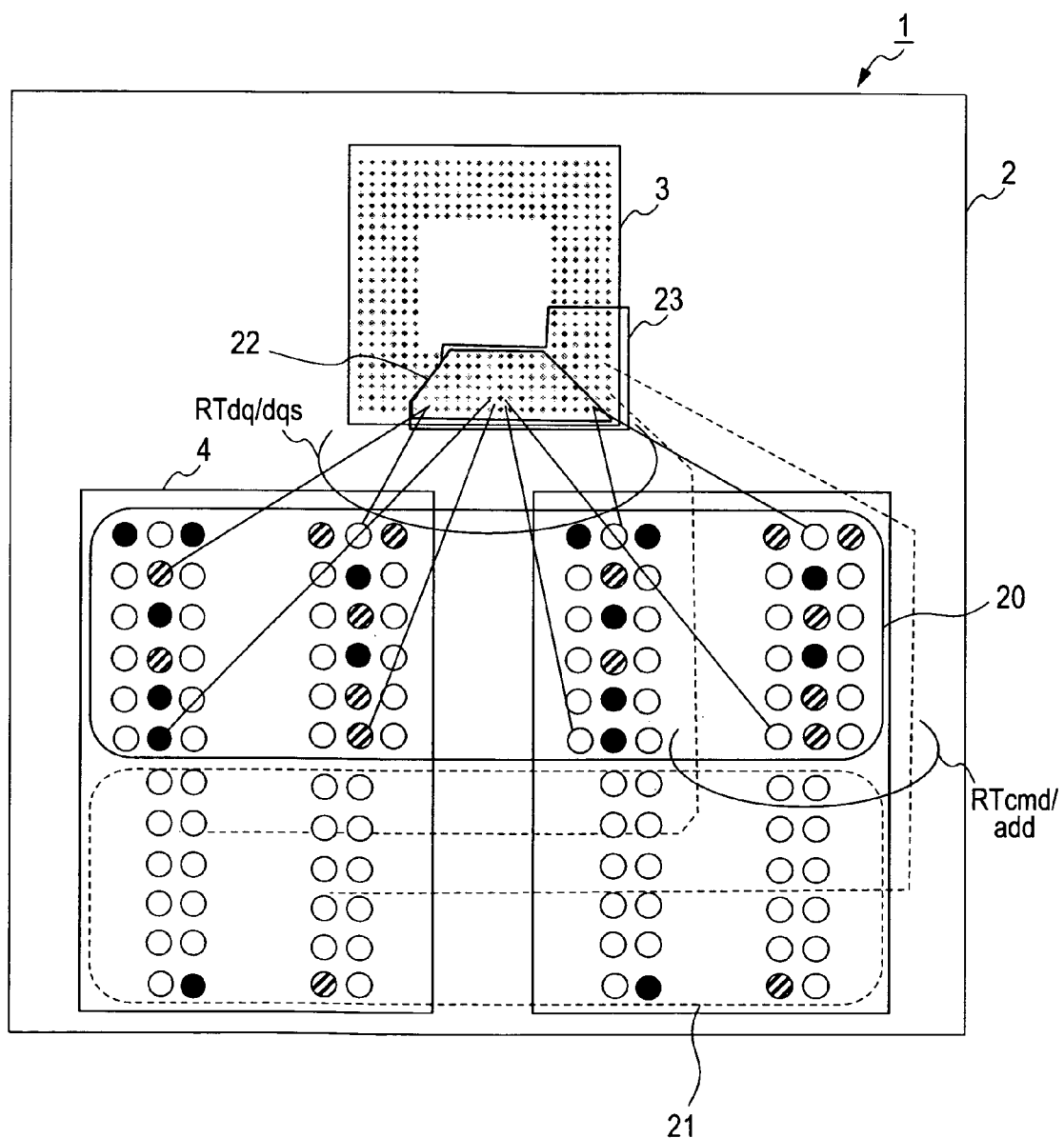
FIG. 2 is a plan view illustrating plane layout configurations of semiconductor devices.

A plane layout configuration of the semiconductor devices is illustrated in FIG. 2. In the figure, the MCU 3 is facedown implemented in the upper central portion of the printed circuit board 2. The two DDR-SDRAMs 4 and 5 are implemented below the printed circuit board 2 with being spaced way from each other. The positions of the device bump electrodes 10 and 11 shown in the figure respectively indicate through positions as seen from above, for example.

Although not illustrated in the figure in particular, the MCU 3 has a central processing unit (CPU) which fetches a command and executes it, a program memory which stores programs to be executed by the central processing unit, a SDRAM interface controller which effects interface control on a work RAM and DDR-SDRAMs of the central processing unit, and a clock generator. The clock generator has a DDL circuit. The DDL circuit effects synchronous loop control on a system clock signal supplied from outside to generate a clock signal. The generated clock signal is defined as a standard or reference for a clock synchronous operation of an internal circuit of a microcomputer. The function of the SDRAM interface controller might be realized by a bus state controller.

Figure 3:
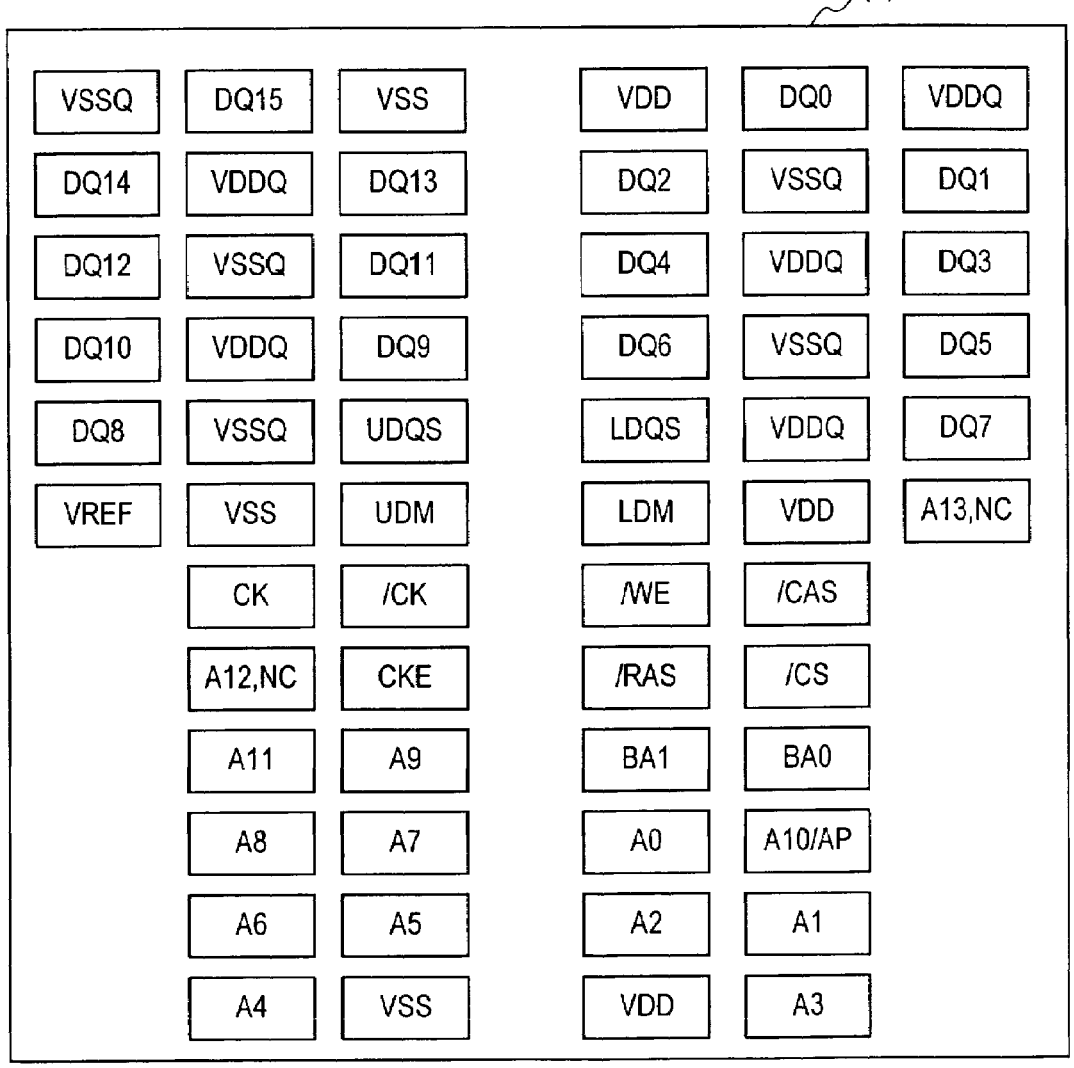
FIG. 3 is a plan view illustrating an external terminal array of each DDR-SDRAM that complies with the JEDEC standard.

An external terminal array of each DDR-SDRAM which complies with the JEDEC standard, is illustrated in FIG. 3. Terminal positions shown in the figure respectively indicate through positions as seen from above. The figure shows an example in which the number of parallel data input/output bits is represented in the form of 16 bits (×16). DQ0 through DQ15 indicate data input/output terminals, LDQS indicates an input terminal (data strobe terminal) for a data strobe signal with respect to 8-bit data of DQ0 through DQ7, UDQS indicates an input terminal (data strobe terminal) for a data strobe signal with respect to 8-bit data of DQ8 through DQ15, A0 through A13 indicate address input terminals, and BA0 and BA1 indicate bank address input terminals, respectively. /RAS, /CAS and /WE indicate command input terminals, /CS indicates a chip select terminal, CK and /CK indicate differential clock input terminals, CKE indicates a clock enable terminal, LDM indicates an input terminal (data mask terminal) for a data mask signal with respect to the 8-bit data of DQ0 through DQ7, and UDM indicates an input terminal (data mask terminal) for a data mask signal with respect to the 8-bit data of DQ8 through DQ15, respectively. VDD and VDDQ indicate memory power supply terminals, and VSS and VSSQ indicate ground terminals, respectively. VDDQ and VSSQ are dedicated to power supplies and ground for a data input/output system of each DDR-SDRAM and an input/output system circuit for data strobe. VDD and VSS indicate external terminals for power supplies and ground for other circuits of the DDR-SDRAM. In the present embodiment, the same level is supplied to VDDQ and VDD and the same level is supplied to VSSQ and VSS, and they are operated in this condition. VREF indicates an input terminal for a reference potential, which is supplied with a decision level for an external interface in SSTL (Stub Series Terminated Transceiver Logic). NC indicates a non-connecting terminal.

Although the detailed description of the configuration of each DDR-SDRAM is omitted here because its configuration is already known, internal operations are synchronized with differential clocks from the terminals CK and /CK. The differential clocks inputted by bringing the clock enable terminal CKE to an enable level are made effective, so that an input buffer and an output driver circuit are made operable. Inputs from the terminals /RAS, /CAS and /WE are masked until the terminal /CS is rendered enable. Upon a read operation, strobe signals are outputted from the terminals LDQS and UDQS, and read data are outputted from the terminals DQ0 through DQ7 and DQ8 through DQ15 in sync with the cross edges of the strobe signals. Upon a write operation, the terminals LDQS and UDQS are used as strobe signal input terminals, and the strobe signals LDQS and UDQS are edge-changed with timing in which write data is being established.

A terminal layout of each DDR-SDRAM shown in FIG. 2 is identical to FIG. 3. In FIG. 2, reference numeral 20 indicates an area in which the DDR-SDRAMs 4 and 5, data input/output terminals DQ0 through DQ15 and data strobe terminals LDQS and UDQS are disposed. In FIG. 2, reference numeral 21 indicates an area in which the address input terminals A0 through A13 and command input terminals /RAS, /CAS and /WE of each DDR-SDRAM, etc. are almost disposed. Reference numeral 23 indicates an area in which terminals (terminals connected to SDRAM controller) for interface to each DDR-SDRAM in the MCU 3 are disposed. In particular, the data input/output terminals and data strobe terminals are disposed in the area 23 with being biased to the area 22. As is evident from FIG. 2, the DDR-SDRAMs 4 and 5 are disposed over the printed circuit board 2 in such a manner that the data input/output terminals DQ0 through DQ15 and the data strobe terminals LDQS and UDQS are biased toward the MCU 3 as compared with the address input terminals A0 through A13 and the command input terminals /RAS, /CAS and /WE. Wirings of a data system (RTdq/dqs) connected to the data input/output terminals DQ0 through DQ15 and the data strobe terminals LDQS and UDQS are divided into the right and left side from the area 22 and can be wired at relatively short distances. On the other hand, wirings of an address/command system (RTcmd/add) connected to the address input terminals A0 through A13 and the command input terminals /RAS, /CAS and /WE are bypassed in the direction of one DDR-SDRAM 5 and thereafter wired so as to cross both DDR-SDRAMs 4 and 5.

Since the DDR-SDRAM is strict in timing margin of the data system as compared with a single data rate, an improvement in signal quality is essential to malfunction prevention. As for this point, the wirings for connecting the data input/output terminals DQ0 through DQ15 and data strobe terminals LDQS and UDQS in the DDR-SDRAMs 4 and 5 to their corresponding device terminals of the MCU 3 are shortened to enable a reduction in wiring impedance in consideration of the above. If the wiring impedance becomes small, then the reflection of signals on the wirings of the data system is reduced even though the transmitting and receiving ends are not terminated, so that the quality of each signal in the data system is improved. In brief, there is no need to mount a series resistor for termination of the transmitting end to a small semiconductor device like an SIP. Further, it is possible to eliminate even a circuit for generating a termination power supply for the termination of the receiving end. Further, since the wirings for the address/command system (RTcmd/add) are bypassed in the direction of one DDR-SDRAM 5 and wired so as to cross both DDR-SDRAMs 4 and 5, crossing between the wirings for the address/command system and the wirings for the data system (RTdq/dqs) can be reduced. Accordingly, the wiring of the data system (RTdq) can easily be carried out by reducing the crossing between the wirings for the data system and the wirings for the address/command system. Thus, the wirings for the data system (RTdq/dqs) can be wired in preference to the wiring layer L2 adjacent to a ground plane low in impedance, and the quality of each signal is further improved.

From the above, for example, the wiring impedance of the data system on the printed circuit board can be set to from 60Ω to 50Ω or less, and the wiring length can also be set to 20 mm or less. The impedance of the output driver as viewed from each device terminal of the data system generally ranges from 20Ω to 30Ω. The wiring impedance of the data system is lowered so that ringing due to signal reflection can be suppressed.

<<Layout of Data-System Wirings for Semiconductor Memory Devices>>

Figure 4:
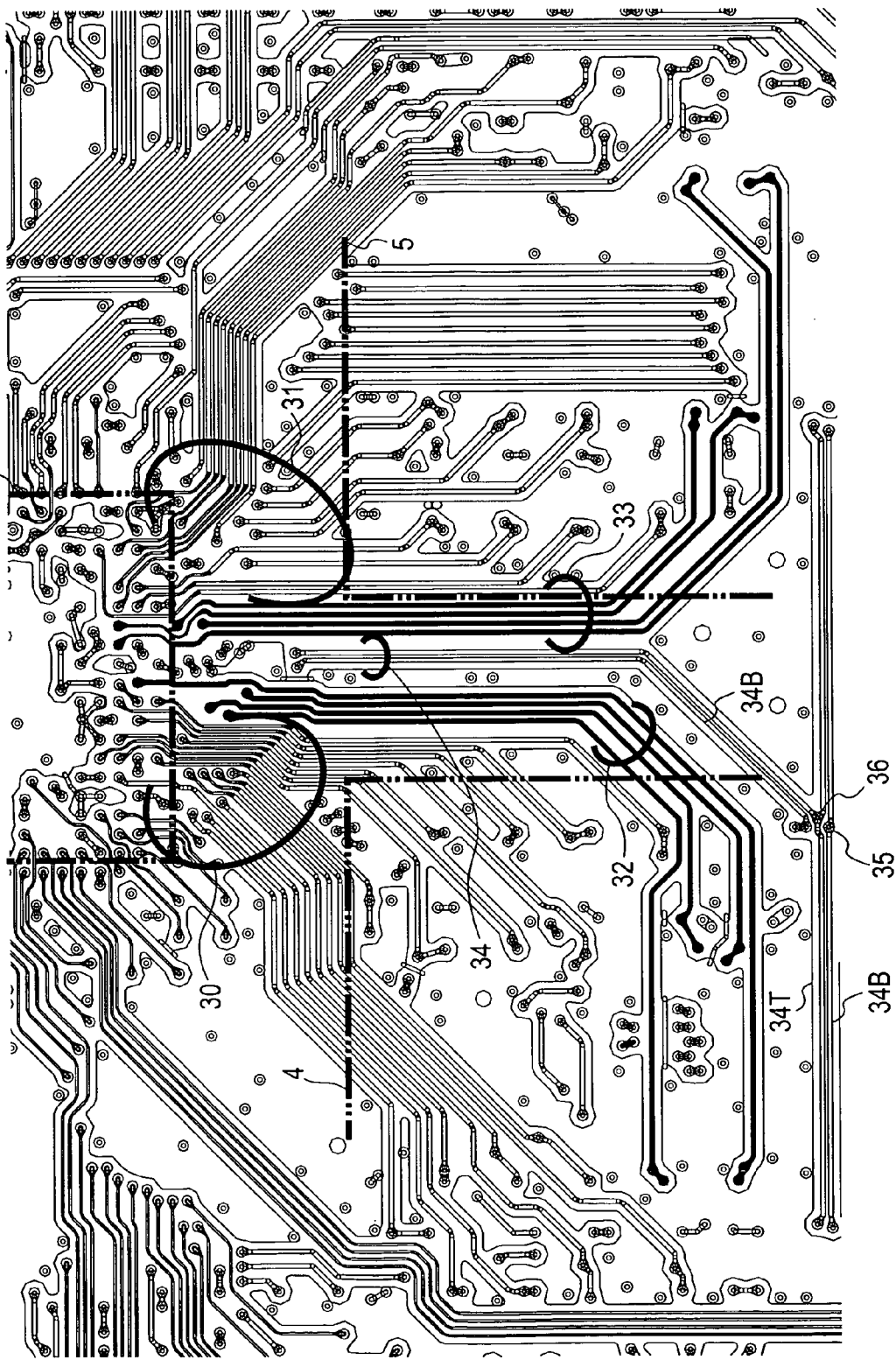
FIG. 4 is a wiring pattern diagram illustrating wirings of a data system, which connect an MCU and the DDR-SDRAMs in a wiring layer L2.

The wirings for the data system, which connect the MCU 3 and DDR-SDRAMs 4 and 5 in the wiring layer L2, are illustrated in FIG. 4. Reference numeral 30 indicates data signal wirings which extend from the MCU 3 to the data input/output terminals DQ0 through DQ15 of the DDR-SDRAM 4, reference numeral 31 indicates data signal wirings which extend from the MCU 3 to the data input/output terminals DQ0 through DQ15 of the DDR-SDRAM 5, reference numeral 32 indicates signal wirings which extend from the MCU 3 to the terminals LDQS, UDQS, LDM and UDM of the DDR-SDRAM 4, reference numeral 33 indicates signal wirings which extend from the MCU 3 to the terminals LDQS, UDQS, LDM and UDM of the DDR-SDRAM 5, respectively. Reference numeral 34 indicates a clock signal wiring which extends from the MCU 3 to the clock terminals CK and /CK of the DDR-SDRAMs 4 and 5.

As shown in FIG. 4, the respective signal wirings 32, 33 and 34 are formed using an area defined between the DDR-SDRAMs 4 and 5. The area defined between the DDR-SDRAMs 4 and 5 is vacant in a state in which the data signal wirings 30 and 31 connected to the data terminals DQ and the wirings for the address/command system are few in number. By laying out the signal wirings 32, 33 and 34 in concentrated form using the area defined between the DDR-SDRAMs 4 and 5, it becomes easy to separate a strobe signal wiring from other signal wirings. Therefore, crosstalk relative to other signals can easily be reduced. In this respect, the quality of each signal in the data system is improved.

Further, the data strobe signal wiring is separated from the data signal wirings. The data strobe signal is a timing signal which defines timing or the like for fetching data. Thus, the separation of the data signal wiring and the data strobe signal wiring from each other with a distance kept therebetween makes it possible to easily suppress distortion of a data strobe signal waveform due to a change in data. Even when, for example, the MCU 3 outputs write data of plural bits after the data strobe signal has been raised, the data strobe signal becomes hard to be affected by crosstalk noise and coupling noise even between the data strobe signal and each data signal. Even in this respect, the quality of each signal in the data system is improved.

Furthermore, the wirings 30, 31, 32, 33 and 34, which connect the DDR-SDRAMs 4 and 5 and the MCU 3, are formed specifically for the wiring layer L2 adjacent to the wiring layer L3 used to form the ground plane. Since crosstalk can be suppressed as each signal wiring approaches the power plane and the ground plane, signal quality can be improved even in this respect.

<<Layout of Clock Wirings for Semiconductor Memory Devices>>

The clock signal wiring 34 is configured in a differential pair as illustrated in FIG. 4. Reference numeral 34T indicates a non-inversion clock signal wiring and reference numeral 34B indicates an inversion clock signal wiring. In FIG. 4, the non-inversion clock signal wiring 34T is formed in the wiring layer L2, and the inversion clock signal wiring 34B is almost formed in the wiring layer L2 but straddles the non-inversion clock signal wiring 34T using a wiring (wiring 53 shown in FIG. 9) in the upper wiring layer L1 in midstream. By configuring the clock signal wiring 34 in a differential pair, a noise-resistance characteristic is improved by virtue of canceling action of in-phase nose. Although the clock signal wiring for connecting the MCU 3 and the DDR-SDRAMs 4 and 5 is almost formed in the wiring layer L2 in a manner similar to other signal wirings, the very part thereof extends to other wiring layers.

The clock signal wirings 34T and 34B are wirings for connecting the clock terminals of the DDR-SDRAMs 4 and 5 to their corresponding terminals of the MCU 3. And the clock signal wirings 34T and 34B have branches or stubs in midstream with the MCU 3 as a base point or origin and form length-equalization or isometric paths extending to the respective DDR-SDRAMs 4 and 5. Reference numerals 35 and 36 indicate the positions of the branches in the midstream respectively. Since the clock signal wiring 34 becomes easy to separate from other signal wirings by intensively disposing the clock signal wiring 34 between the mounted DDR-SDRAMs 4 and 5, a reduction in crosstalk relative to other signals becomes easy. Further, since the DDR-SDRAMs 4 and 5 are positioned on both sides beyond the branch positions 35 and 36 of the clock signal wiring 34, length-equalization of the clock signal wiring 34 extending from the MCU 3 to both DDR-SDRAMs 4 and 5 becomes easy. In this respect, signal quality is improved.

The clock signal wiring 34 is disposed away from the data signal wirings 30 and 31 and the strobe signal wirings 32 and 33. Influences of crosstalk and coupling noise among the data signal wirings 30 and 31 and the signal wirings 32 and 33 for the data strobe signal and the data mask or the like can also be reduced.

Figure 5:
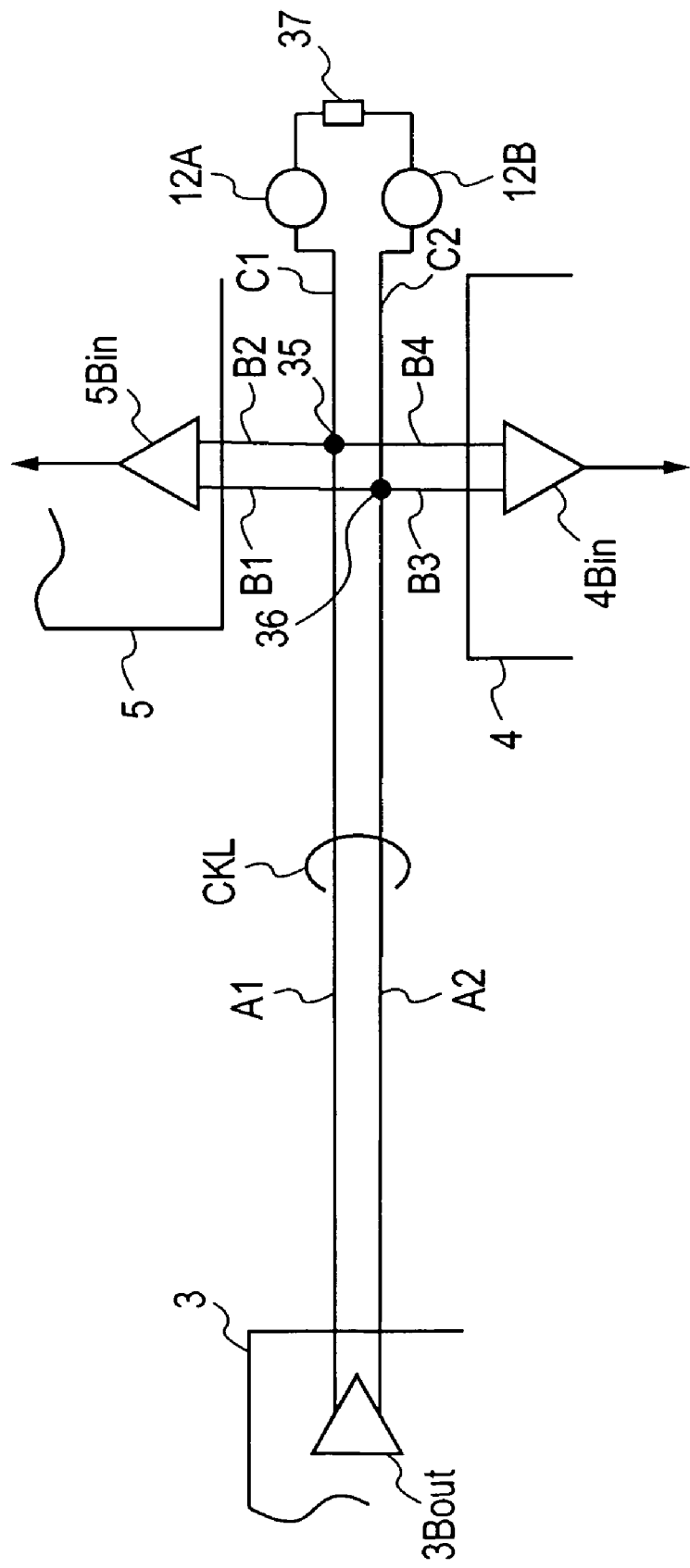
FIG. 5 is a typical diagram showing paths for a clock signal wiring on the whole.

Paths for the clock signal wiring are shown in FIG. 5 on the whole. The whole of clock signal wirings containing the clock signal wiring 34 in the wiring layer L2 is collectively called CKL. 3Bout indicates an output buffer for a clock signal in the MCU 3, 4in indicates an input buffer for the clock signal in the DDR-SDRAM 4, and 5in indicates an input buffer for the clock signal in the DDR-SDRAM 5. Upon length-equalization of the clock wirings, A1=A2, B1=B2=B3=B4, and C1=C2 are realized within a predetermined allowance error range.

Reference numerals 12A and 12B indicate a pair of substrate bump electrodes for connection of a differential terminating resistor, which are connected to the branch points 35 and 36 of the clock signal wiring. The differential terminating resistor 37 is connected to the substrate bump electrodes 12A and 12B. Signal quality is always required for a differential clock beyond other signals. In consideration of it, termination processing is adopted for the clock wirings for the differential clock. At this time, the pair of substrate bump electrodes 12A and 12B for the connection of the differential terminating resistor may preferably be disposed adjacent to each other. This is because length equalization and short wiring relative to the clock wiring paths for differential termination also become easy.

Figure 6:
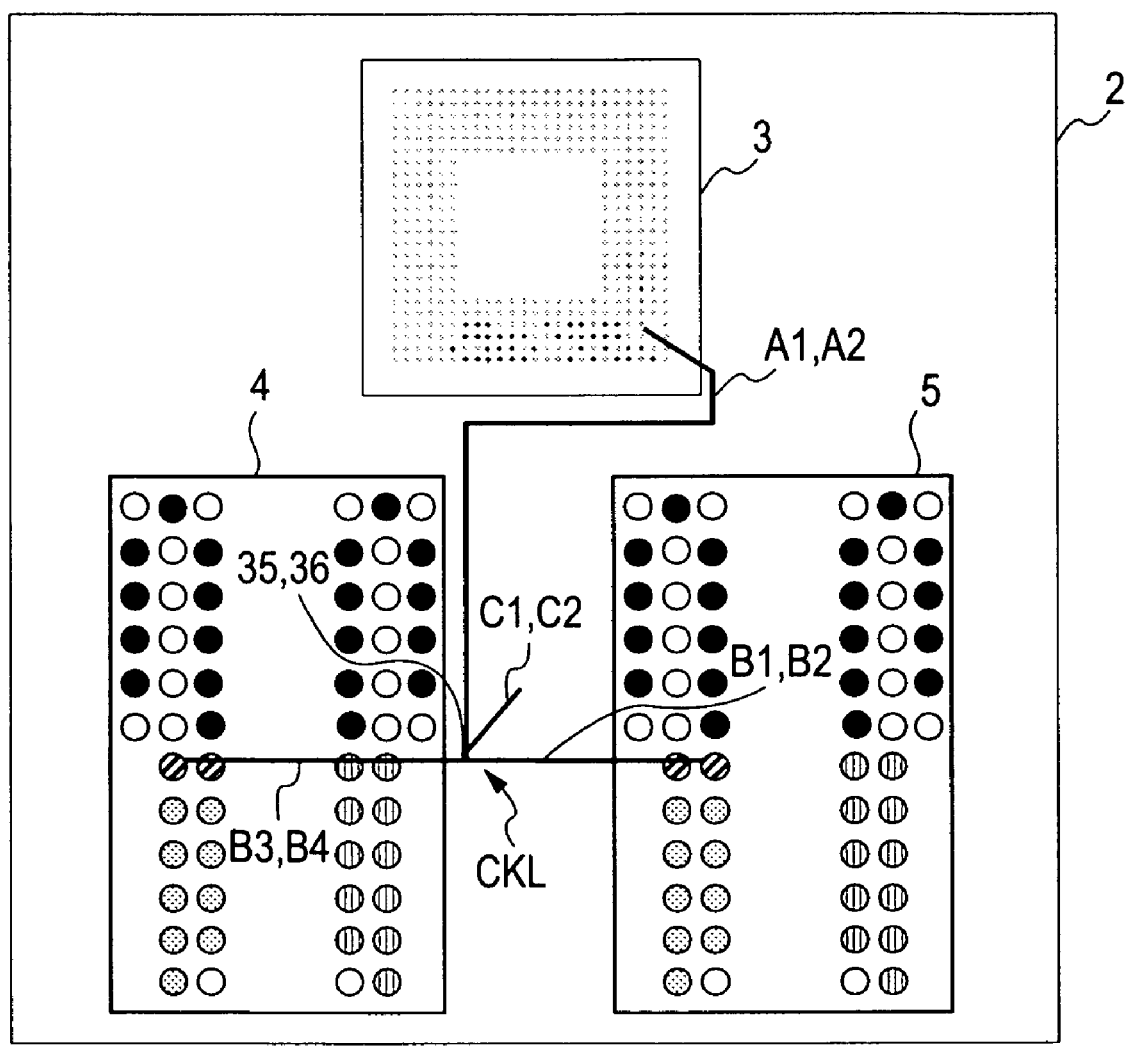
FIG. 6 is a typical diagram showing the relationship between the whole paths for the clock signal wiring employed in the semiconductor device and semiconductor devices.

The relationship between the whole paths for the clock signal wiring employed in the semiconductor device 1 and the semiconductor devices 3, 4 and 5 is typically shown in FIG. 6. The area defined between the DDR-SDRAMs 4 and 5 is used for their wiring paths as described based on FIG. 4.

Figure 7:
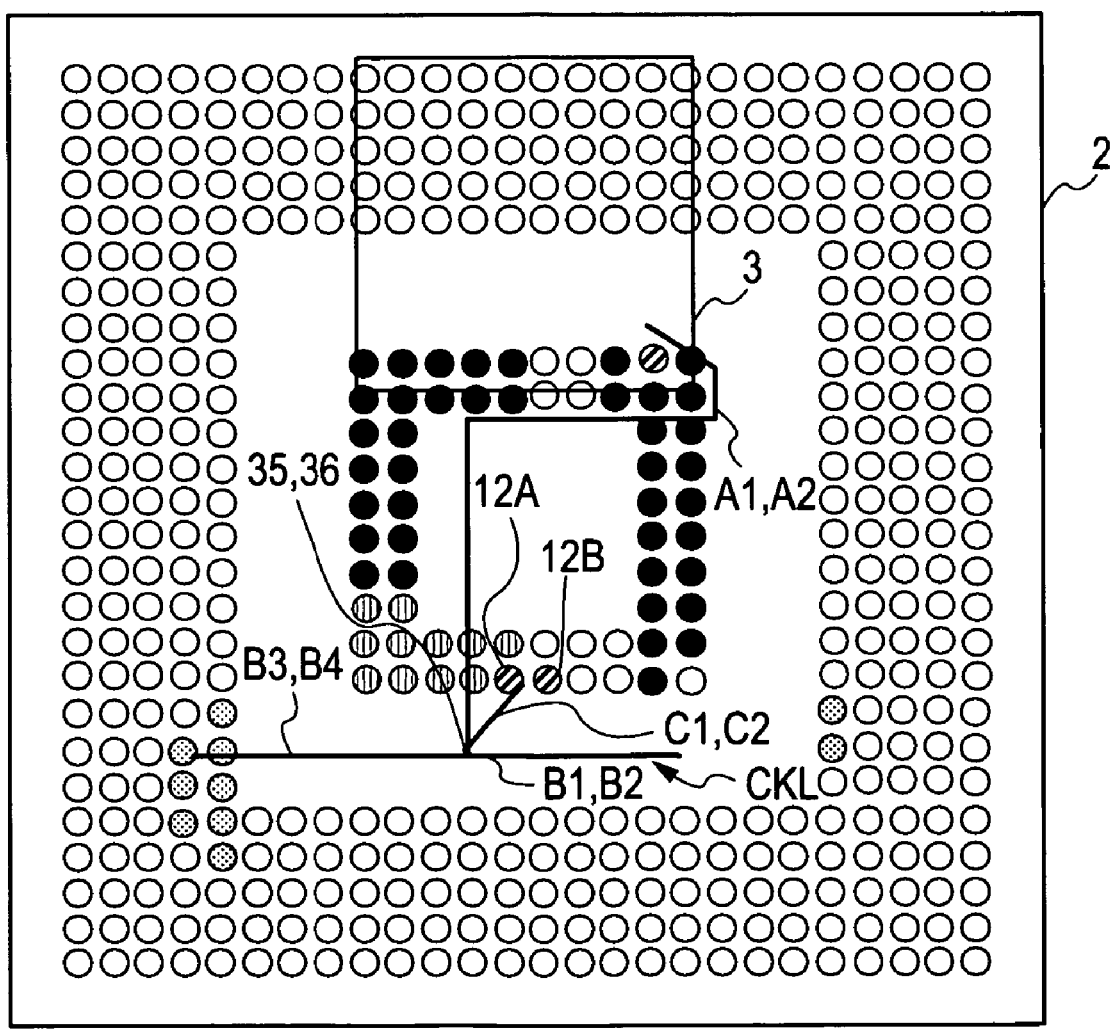
FIG. 7 is a typical diagram showing the relationship between the whole paths for the clock signal wiring employed in the semiconductor device and the placement of substrate bump electrodes.

The relationship between the whole paths for the clock signal wiring employed in the semiconductor device 1 and the layout of the substrate bump electrodes 12 is typically shown in FIG. 7. As described in FIG. 4, the pair of substrate bump electrodes 12A and 12B for connection of the differential terminating resistor is adjacent to each other and allocated to their corresponding close positions as viewed from the branch positions 35 and 36. Here in particular, the substrate bump electrodes 12 of the printed circuit board 2 are disposed with being separated into an outer peripheral bump electrode group in which plural rows (5 rows, for example) are disposed so as to turn around, and a central bump electrode group (turning-around of two rows at its inner peripheral portion). The substrate bump electrodes 12A and 12B for the clock signal are placed in the central bump electrode group.

Figure 8:
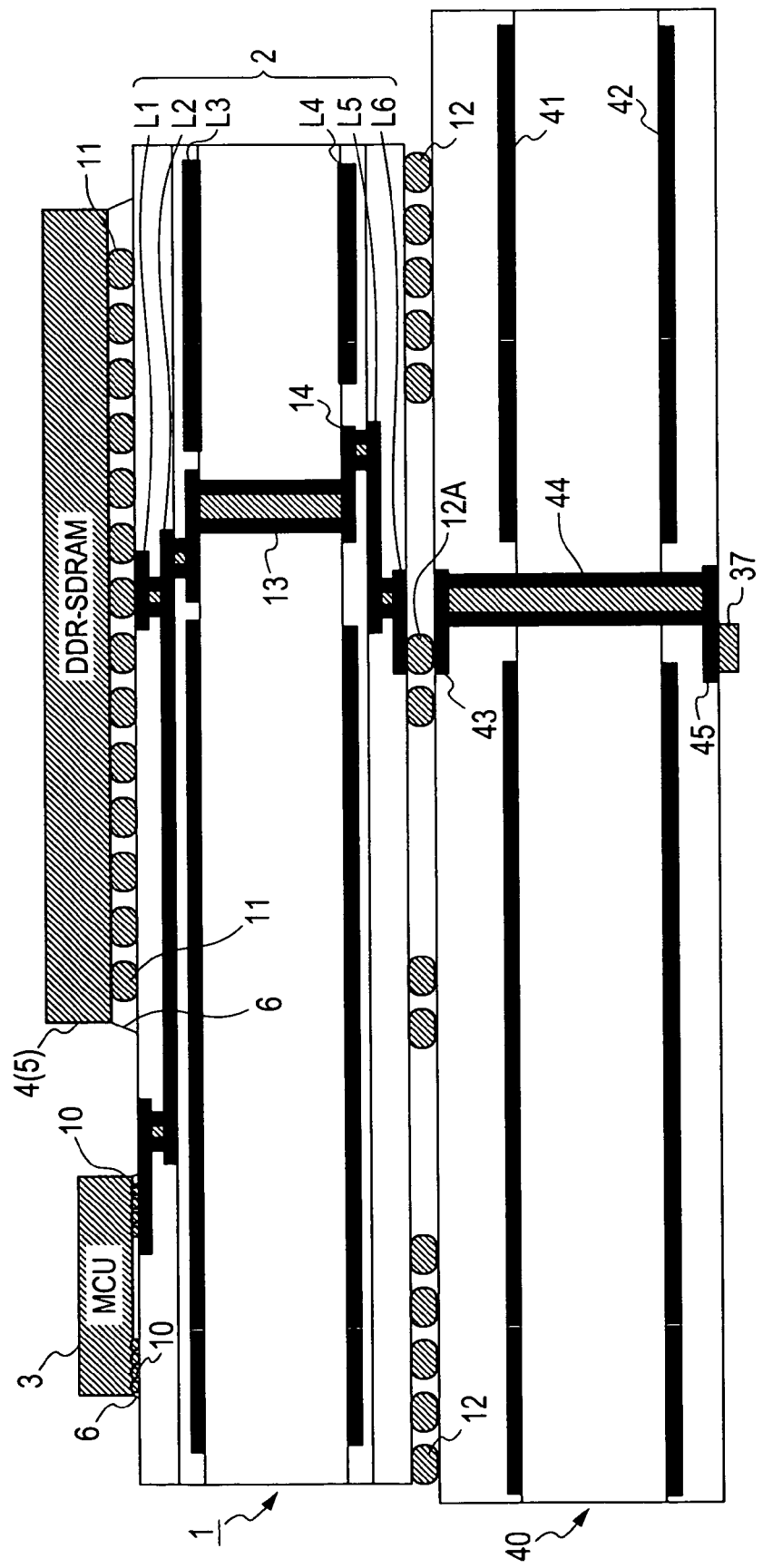
FIG. 8 is a cross-sectional view illustrating a vertical sectional structure of a semiconductor device mounted onto a motherboard.

FIG. 8 is a vertical cross-sectional view of the semiconductor device 1 mounted onto a motherboard. A connection form of a differential terminating resistor 37 implemented in the motherboard 40 and the semiconductor device 1 implemented over the motherboard 40 is illustrated in the same figure. The motherboard 40 has a ground plane 41 and a power plane 42 both provided over the front and back surfaces of a core and has wiring layers corresponding to their surface layers. On the motherboard 40, the substrate bump electrode 12A is made conductive to its corresponding surface layer wiring 45 of its back surface via a through hole 44 from a surface layer wiring 43 placed directly below the substrate bump electrode 12A. One end of the differential terminating resistor 37 is coupled to the surface layer wiring 45. Although not shown in the figure in particular, a wiring path for the substrate bump electrode 12B is also configured adjacent to that on the substrate electrode side in like manner, and is connected to the other end of the differential terminating resistor 37. In brief, the substrate bump electrodes 12A and 12B and the differential terminating resistor 37 are wired in the shortest path therebetween as viewed substantially in only the direction of thickness of the printed circuit board 40.

Figure 9:
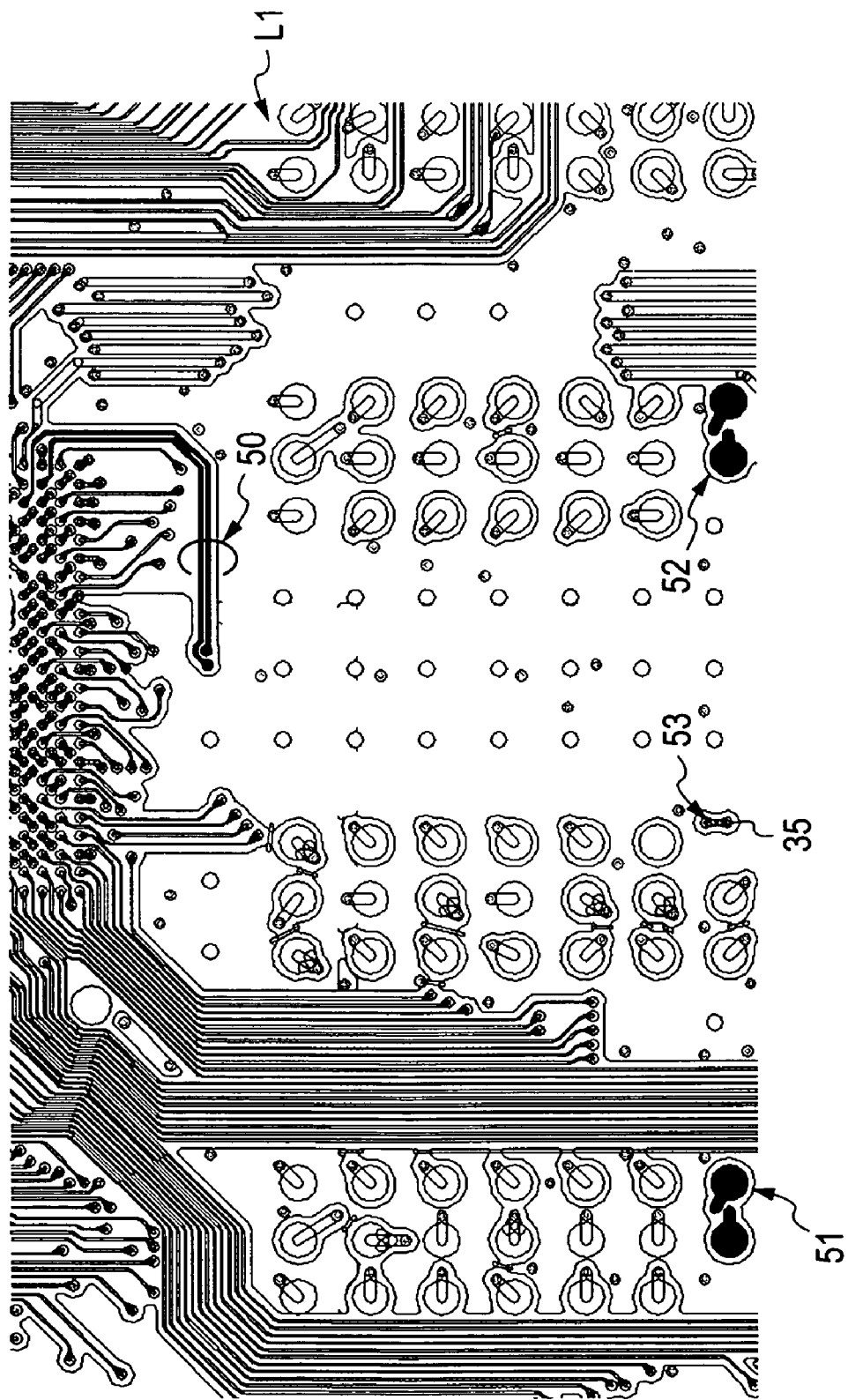
FIG. 9 is a plan view showing paths in a wiring layer L1, of a clock signal wiring CKL.

FIG. 9 is a plan view showing paths in the wiring layer L1, of the clock signal wiring CKL. Reference numeral 50 indicates a clock signal wiring in the wiring layer L1, reference numeral 51 indicates a clock input device bump electrode of the DDR-SDRAM 4, and reference numeral 52 indicates a clock input device bump electrode of the DDR-SDRAM 5. Reference numeral 53 indicates a wiring connected to the inversion clock signal wiring 34B in midstream in FIG. 4.

Figure 10:
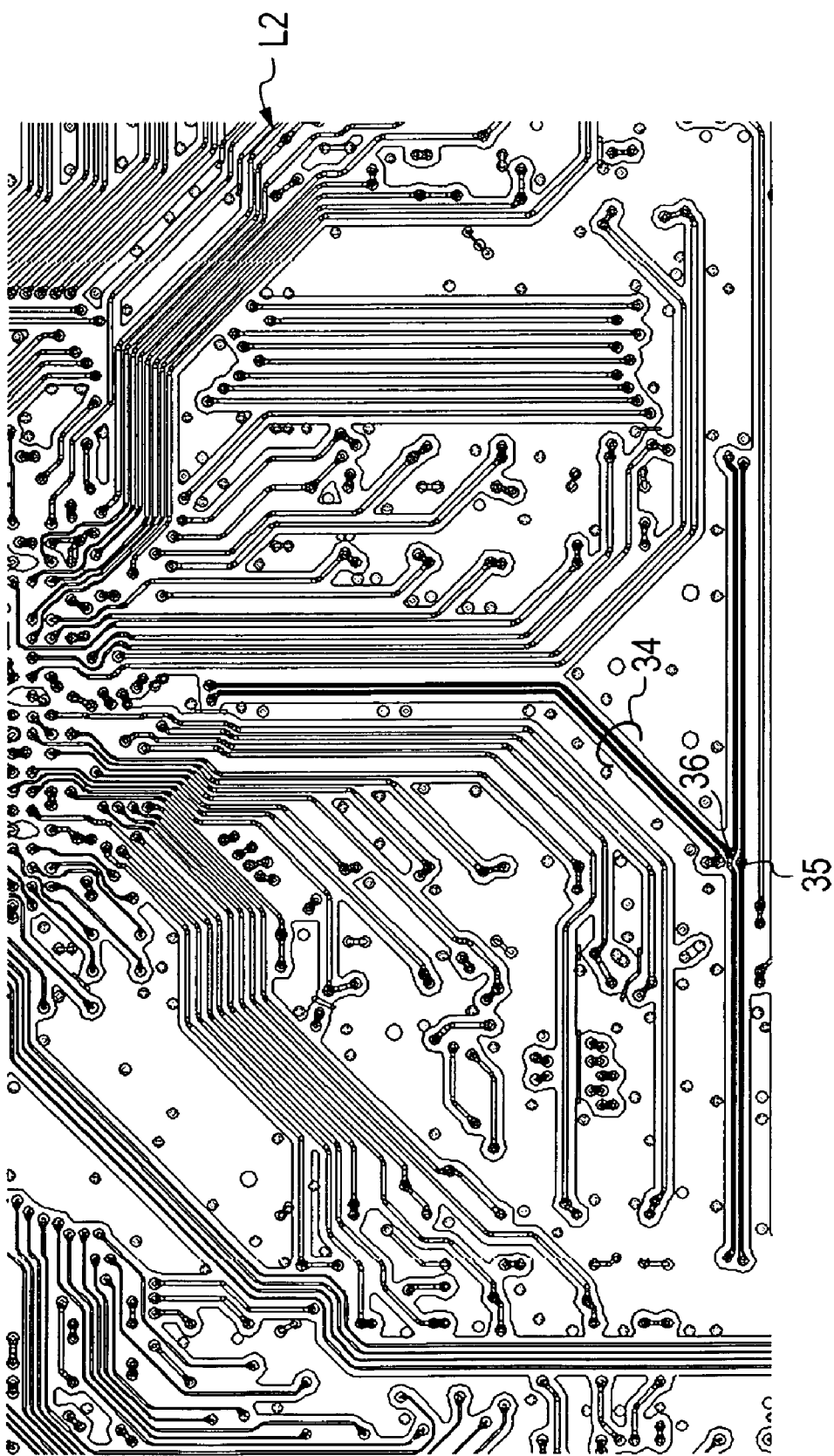
FIG. 10 is a plan view showing paths in a wiring layer L2, of the clock signal wiring CKL.

FIG. 10 is a plan view showing paths in the wiring layer L2, of the clock signal wiring CKL. Reference numeral 34 indicates a clock signal wiring in the wiring layer L2.

Figure 11:
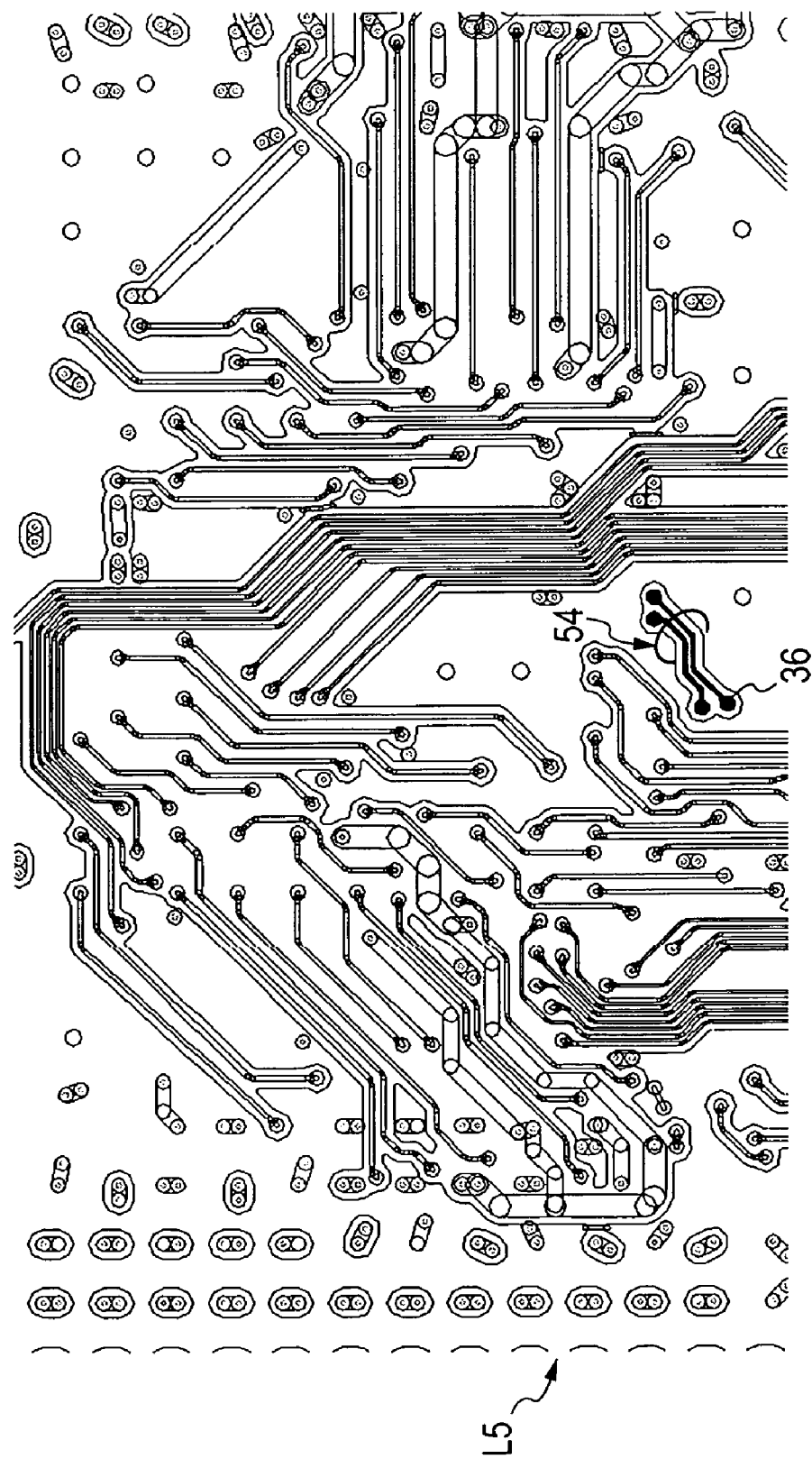
FIG. 11 is a plan view showing paths in a wiring layer L5, of the clock signal wiring CKL.

FIG. 11 is a plan view showing paths in the wiring layer L5, of the clock signal wiring CKL. Reference numeral 54 indicates a clock signal wiring in the wiring layer L5, which is led out from the branch point position of the clock signal wiring 34.

Figure 12:
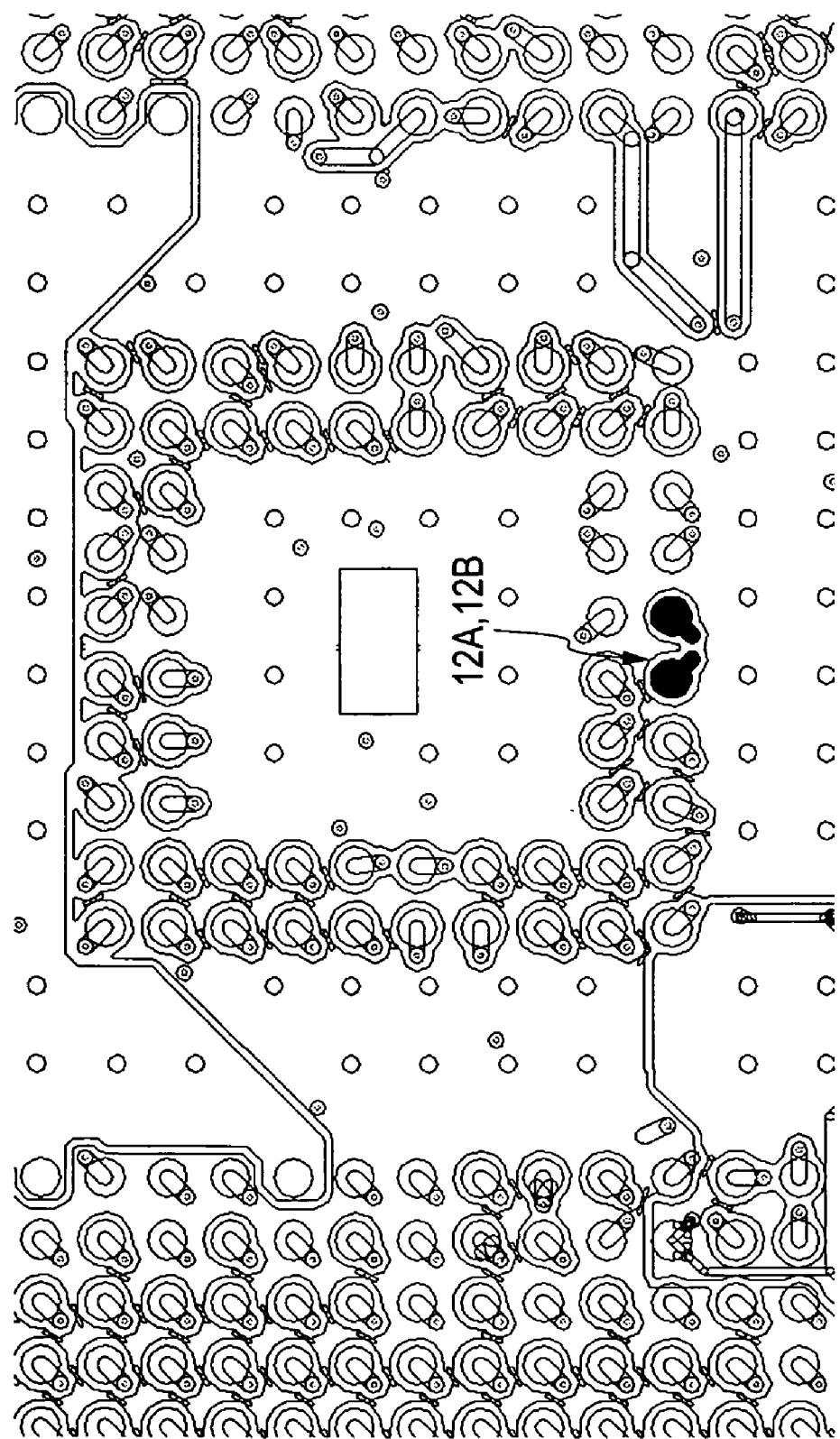
FIG. 12 is a plan view showing substrate bump electrodes which constitute some of the clock signal wiring CKL formed in a wiring layer L6.

FIG. 12 shows the substrate bump electrodes 12A and 12B of the clock signal wiring CKL formed in the wiring layer L6. The substrate bump electrodes 12A and 12B are connected to the clock signal wiring 54.

As described above, the clock signal wiring CKL for the DDR-SDRAMs 4 and 5 is configured in the form of a differential pair. Topologies of wirings extending therealong are length-equalized as shown in FIG. 5. Further, the clock wiring CKL is also disposed using space between the SDRAMs 4 and 5 in a manner similar to the data strobe wiring and the data mask wiring. Most of these clock signal wirings CKL is formed using the buildup layer 9 placed over the upper surface of the core 8. Most thereof is formed using the wiring layer L2 that contacts the wiring layer L3 in which the ground plane is formed. Thus, a reduction in impedance and a reduction in crosstalk noise can be attained even with respect to the clock signal wiring CKL.

At spots where the wiring 50 crosses the data-system wirings 31 and 33 as in the wiring 50 shown in FIG. 9, the data-system wirings are preferentially laid in the wiring layer L2, and the clock signal wiring is wired in the wiring layer L1. Since the data-system wirings are respectively operated as isolated wirings having independent signal values, there is a need to lower their self impedances. On the other hand, since the clock signal wiring is operated as a differential pair, differential impedance may be reduced. This is because since it is possible to adjust not only the relationship of distance to the ground plane but also the relationship of distance between the differential pair, the degree of freedom of the clock signal wiring is high, and even when the clock signal wiring is formed in the wiring layer L1 away from the ground plane, it is small in influence as compared with the data-system wirings.

Wirings (wirings of C1 and C2 in FIG. 5) for the substrate bump electrodes 12A and 12B branch in the neighborhood of the branch points of the wirings for both the DDR-SDRAMs 4 and 5 and extend through the core layer 8, and they are wired using the wiring 54 in the wiring layer L5, thus making it possible to contribute to short-wiring. Since the branch positions 35 and 36 of the clock wiring CKL are placed below the inner peripheral bump electrodes in the plan view of FIG. 7, the substrate bump electrodes 12A and 12B are also disposed with respect to the inner peripheral bump electrodes close thereto.

The substrate bump electrodes 12A and 12B connected with the terminating resistor 37 are allocated to the substrate bump electrodes in the center of the printed circuit board as illustrated in FIG. 7. Since the terminating resistor 37 may simply be connected to the substrate bump electrodes 12A and 12B and needs not to be connected to another large semiconductor device of other size, no problem occurs. In brief, it means that there is no need to, on the motherboard, pull out the wirings connected to the substrate bump electrodes 12A and 12B to the outside of a mounting area of the printed circuit board 2.

<<Allocation of Major Signal Wirings in Multilayer Wiring Board>>

As described in FIG. 1, the printed circuit board 2 has the core layer 8 and the buildup layers 9 and 16 formed over its front and back surfaces. The core layer 8 has the power plane and the ground plane provided over its front and back surfaces. The corresponding signal wirings for connecting the MCU 3 and the DDR-SDRAMs 4 and 5 are formed using the wiring layers L1 and L2 for the buildup layer 9 on the mounting side of the MCU 3 and DDR-SDRAMs 4 and 5. The corresponding signal wirings for connecting the branch points 35 and 36 to the substrate bump electrodes 12A and 12B for connection of the differential terminating resistor 37 are formed using the wiring layers L5 and L6 for the buildup layer 16 on the side of the formation of the substrate bump electrodes with respect to the core layer 8. Thus, the routing lengths of the signal wirings for connecting the MCU 3 and the DDR-SDRAMs 4 and 5 become short, thus making it possible to contribute to a reduction in wiring impedance of each signal wiring and short-wiring.

<<Layout of Power Supply Terminals in Consideration of Power Plane Structure of Motherboard>>

Figure 13:
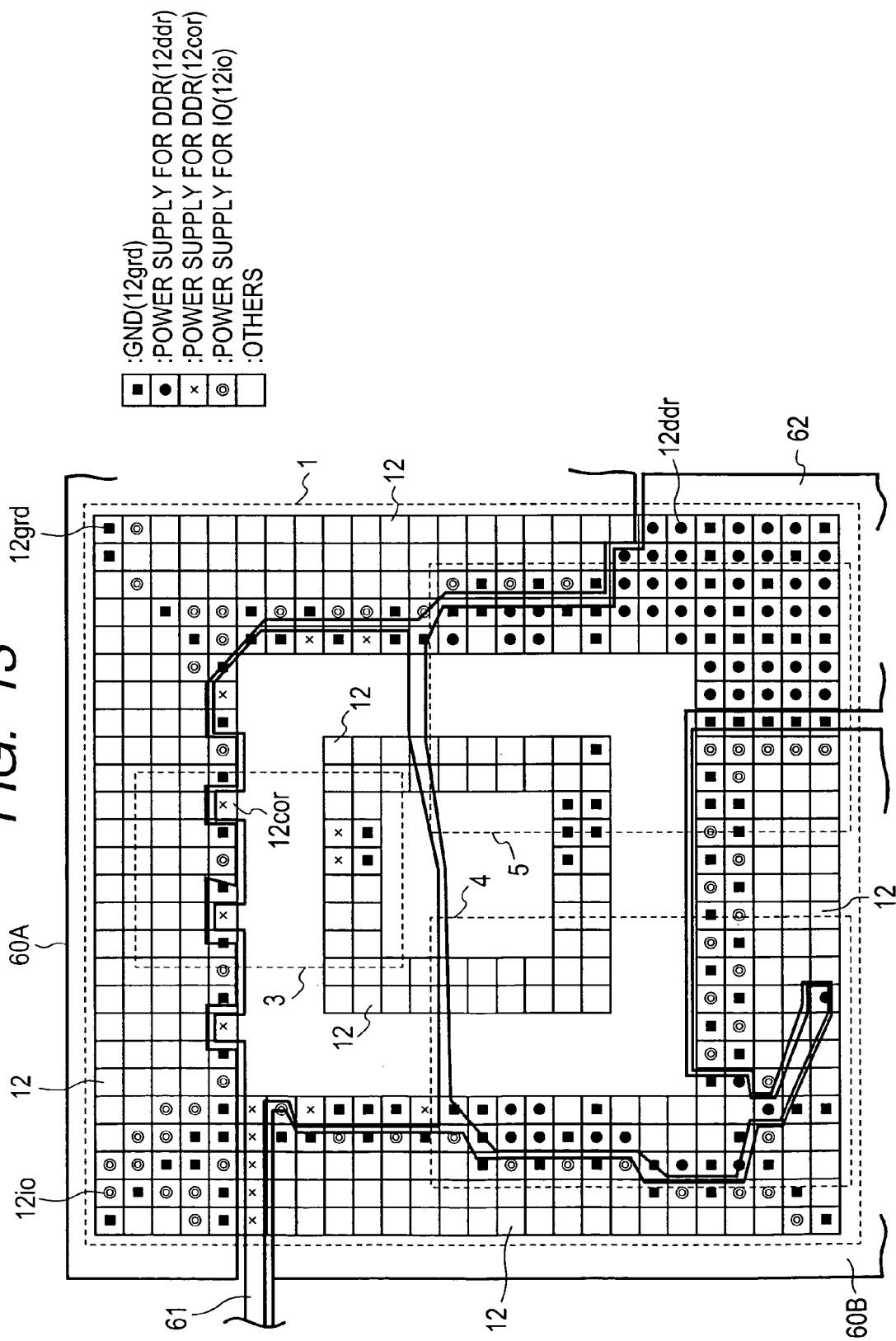
FIG. 13 is a plan view showing the relationship between major functional assignments of substrate bump electrodes and a power plane of the motherboard.

Major functional assignments of substrate bump electrodes 12 and a power plane of a motherboard are shown in FIG. 13. In the figure, an open square indicates one substrate bump electrode. It is a matter of course that actual substrate bump electrodes are not brought into contact with one another. Solid or filled-in squares means ground bump electrodes 12gnd each of which receives a ground power supply (GND). The ground potential is 0V, for example. Solid round or circle signs means power supply bump electrodes 12ddr for DDR, each of which accepts an operating power supply (power supply for DDR) for a DDR-SDRAM interface circuit used for the DDR-SDRAMs 4 and 5 and MCU 3. The DDR power supply is 2.5V, for example. x marks means core power supply bump electrodes 12cor each of which accepts a core power supply (power supply for core) of the MCU 3. The core power supply is 1.25V, for example. Double round or circle signs means IO power supply bump electrodes 12io each of which receives a power supply (IO power supply) for external interface, other than the core power supply of the MCU 3. The IO power supply is 3.3V, for example. Other bump electrodes of the substrate bump electrodes 12 are assigned to various bump electrodes for external interface, which are principally typified by data, addresses and control signals.

As described above, the substrate bump electrodes 12 are separated into the turned-around outer peripheral bump electrode group and the central bump electrode group surrounded thereby. The core power supply bump electrodes 12cor are disposed close to the MCU 3 and principally disposed in large numbers at the upper innermost peripheral portion of FIG. 13, of the outer peripheral bump electrode group. The DDR power supply bump electrodes 12ddr are disposed close to the DDR-SDRAMs 4 and 5 and principally disposed in large numbers at the lower innermost peripheral portion of FIG. 13, of the outer peripheral bump electrode group. The IO power supply bump electrodes 12io are placed in the outer peripheral bump electrode group in distributed form together with the bump electrodes for external interface and ground bump electrodes 12gnd. The bump electrodes for external interface, which are used for addresses and data or the like, should unavoidably be disposed in distributed form due to large numbers. However, from the viewpoint that the parasitic inductance of a signal path is reduced, the IO power supply bump electrodes 12io are disposed so as to contact the bump electrodes for external interface and the ground bump electrodes 12gnd. Since, at this time, the substrate bump electrodes 12 are separated into the turned-around outer peripheral bump electrode group and the central bump electrode group surrounded thereby, it is advisable to allocate the bump electrodes for external interface to the outer peripheral bump electrode group to the utmost from the viewpoint that routing of the signal wirings connected to the bump electrodes for external interface on the motherboard is reduced. Thus, the IO power supply bump electrodes 12io disposed around in dispersed form in contact with the bump electrodes for external interface are also assigned to the outer peripheral bump electrode group. Since many of the core power supply bump electrodes 12cor and the DDR power supply bump electrodes 12ddr are disposed at the innermost peripheral portion of the outer peripheral bump electrode group, IO power planes are divided into two of 60A and 60B in the motherboard and formed so as to surround a core power plane 61 and a DDR power plane 62 in order to supply power from the motherboard to respective power supply pads of the semiconductor device 1. If done in this way, the leading-out of power to the core power plane 61 and the DDR power plane 62 can easily be carried out using an area between the divided IO power planes 60A and 60B. The IO power planes 60A and 60B are connected to the IO power supply bump electrodes 12io, the core power plane 61 is connected to the core power supply bump electrodes 12cor, and the DDR power plane 62 is connected to the DDR power supply bump electrodes 12ddr.

The external interface bump electrodes using the IO power supply perform a transfer of signals between the semiconductor device 1 and the motherboard 40. Only the MCU 3 needs the core power supply, and the core power supply bump electrodes 12cor may exist in such an area as to contain the MCU 3 in the neighborhood of the MCU 3. Only the DDR-SDRAMs 4 and 5 and the DDR interface circuit section of the MCU 3 need the DDR power supply. Since the DDR-SDRAMs are located on the side below the MCU 3 and the DDR interface circuit section of the MCU 3 is disposed on the DDR-SDRAMs 4 and 5 sides, the DDR power supply bump electrodes 12ddr may be placed close to the DDR-SDRAMs 4 and 5. Since the core power supply bump electrodes 12cor are irrelevant to the transfer of signals between the semiconductor device 1 and other devices and similarly circuits operated at the DDR power supply are also closed within the semiconductor device, there is no need to dispose the bump electrodes 12cor and 12ddr in large numbers on the outer periphery of the outer peripheral bump electrode group. Disposing most IO power supply bump electrodes 12io outside the bump electrodes 12cor and 12ddr makes it easy to adopt pairs with the bump electrodes (external interface bump electrodes) for signal interface with the outside and enables a reduction in the impedance of a power system. By doing so the layout of the bump electrodes over the printed circuit board, the division of the power planes over a system mounting board like the motherboard can be facilitated, and the number of wiring layers in the system mounting board can be reduced, thus making it possible to suppress the cost of the system.

<<Customization of Memory Power Supply Terminals in Semiconductor Memory Devices and Semiconductor Processing Devices>>

Figure 14:
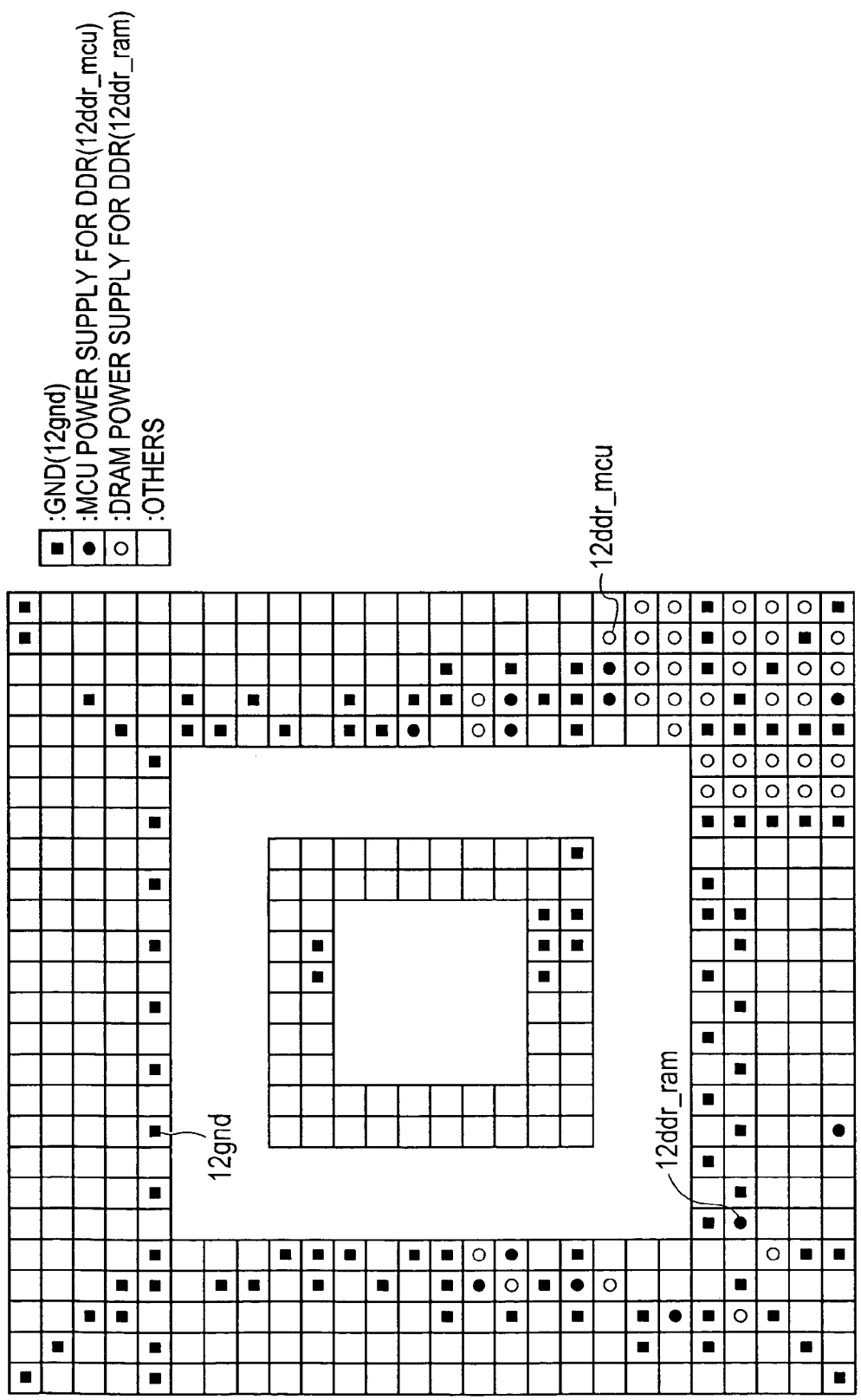
FIG. 14 is a plan view showing functional assignments of DDR power supply bump electrodes.

Functional assignments of DDR power supply bump electrodes are shown in FIG. 14. In the figure, solid square signs means ground bump electrodes 12gnd each of which accepts a ground power supply (GND). The ground potential is 0V, for example. Solid or filled-in round signs means DRAM power supply bump electrodes 12ddr_ram for DDR, each of which accepts an operating power supply (DRAM power supply for DDR) for the DDR-SDRAMs 4 and 5. Open round or circle signs means MCU power supply bump electrodes 12ddr_mcu for DDR, each of which accepts an operating power supply (MCU power supply for DDR) for the DDR-SDRAM interface of the MCU 3. The DRAM power supply for DDR and the MUC power supply for DDR are both 2.5V, for example. Substrate bump electrodes indicated by open squares are substrate bump electrodes to which other functions are assigned.

The reason for division into the DRAM power supply electrodes 12ddr_ram for DDR and the MCU power supply bump electrodes 12ddr_mcu for DDR is that their power supplies can reliably be separated when consideration is made in such a manner that the DDR-SDRAMs 4 and 5 can be tested singly from the MCU 3 before the semiconductor device 1 is mounted onto the motherboard. In brief, even though the output of the DDR memory interface circuit section of the MCU 3 is not brought to a high output impedance state even when the MCU 3 is placed in a standby state or a not-ready state, its handling can be carried out when the DDR-SDRAMs 4 and 5 are tested singly. The DRAM power supply bump electrodes 12ddr_ram for DDR and the MCU power supply bump electrodes 12ddr_mcu are connected to the common power supply wiring or power plane on the motherboard in a state in which they are being mounted onto the motherboard. In brief, the common power is supplied to both the power supply bump electrodes 12ddr_ram and 12ddr_mcu from the motherboard.

Figure 15:
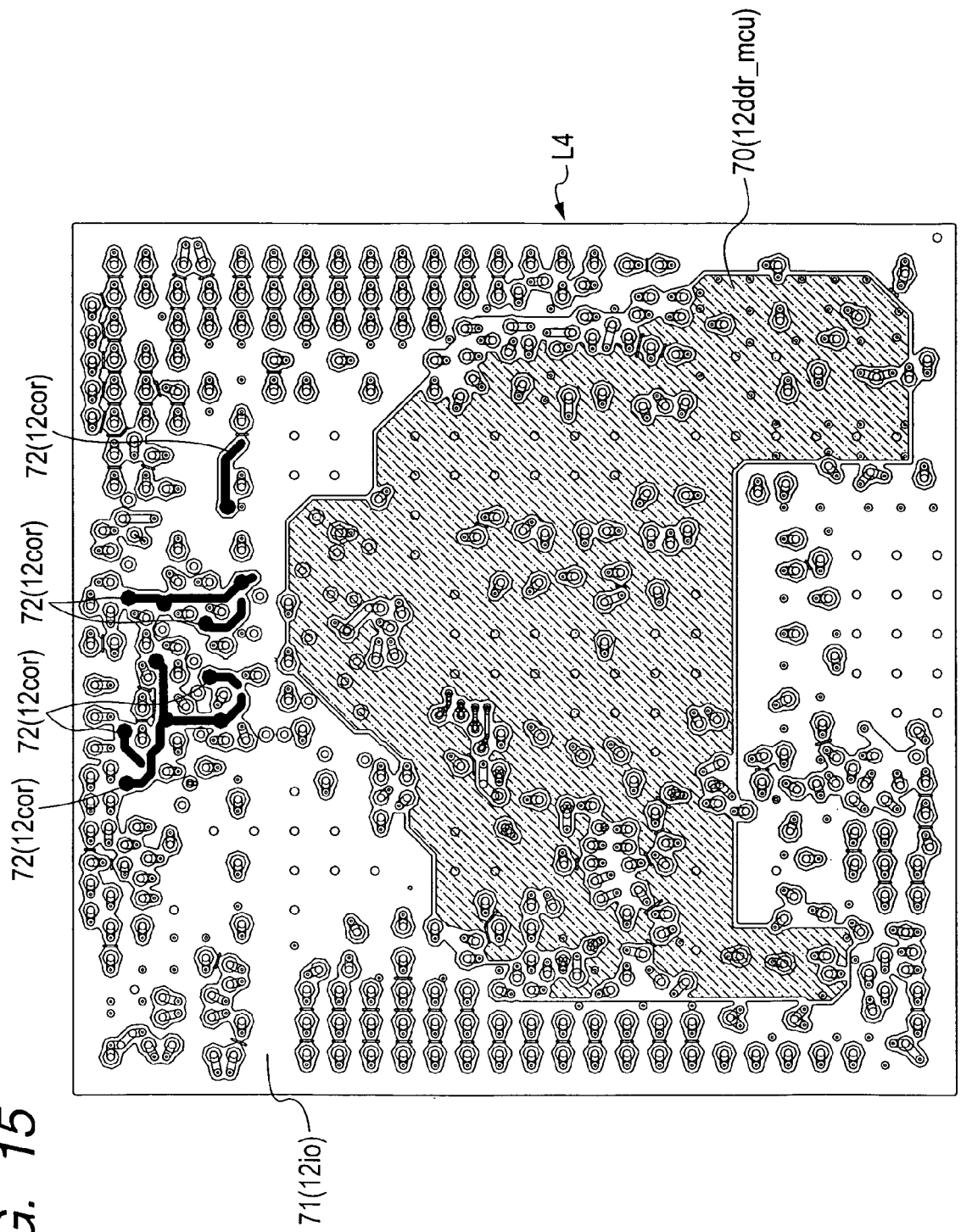
FIG. 15 is a plan view showing power supply wirings formed in a wiring layer L4.

Power planes formed in the wiring layer L4 are shown in FIG. 15. Reference numeral 70 indicates a DDR power plane connected to the MCU power supply bump electrodes 12ddr_mcu for DDR, reference numeral 71 indicates an IO power plane connected to the IO power supply bump electrodes 12io, and reference numerals 72 indicate core power planes connected to the core power supply bump electrodes 12cor. The core power planes 72 may be defined as thick power wirings or interconnections. Although not shown in the figure in particular, power planes connected to the core power planes 72 are formed even in the wiring layer L6, and both are combined so as to function as a power plane.

Figure 16:
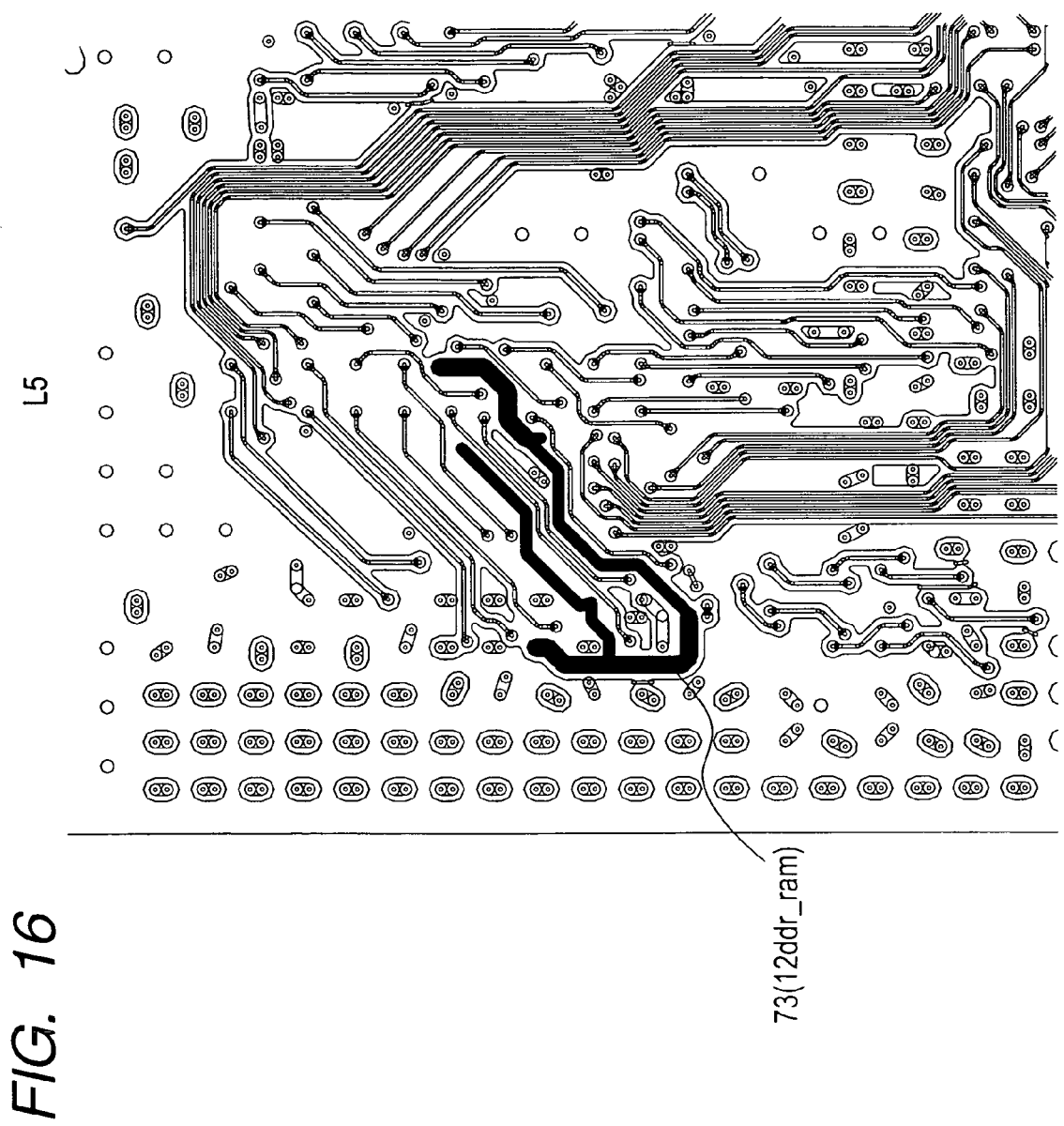
FIG. 16 is a plan view showing a power plane formed in the wiring layer L5.
Figure 17:
FIG. 17 is a plan view showing the wiring layer L4 placed over the wiring layer L5 of FIG. 16 at a position where they overlap each other.
Figure 18:
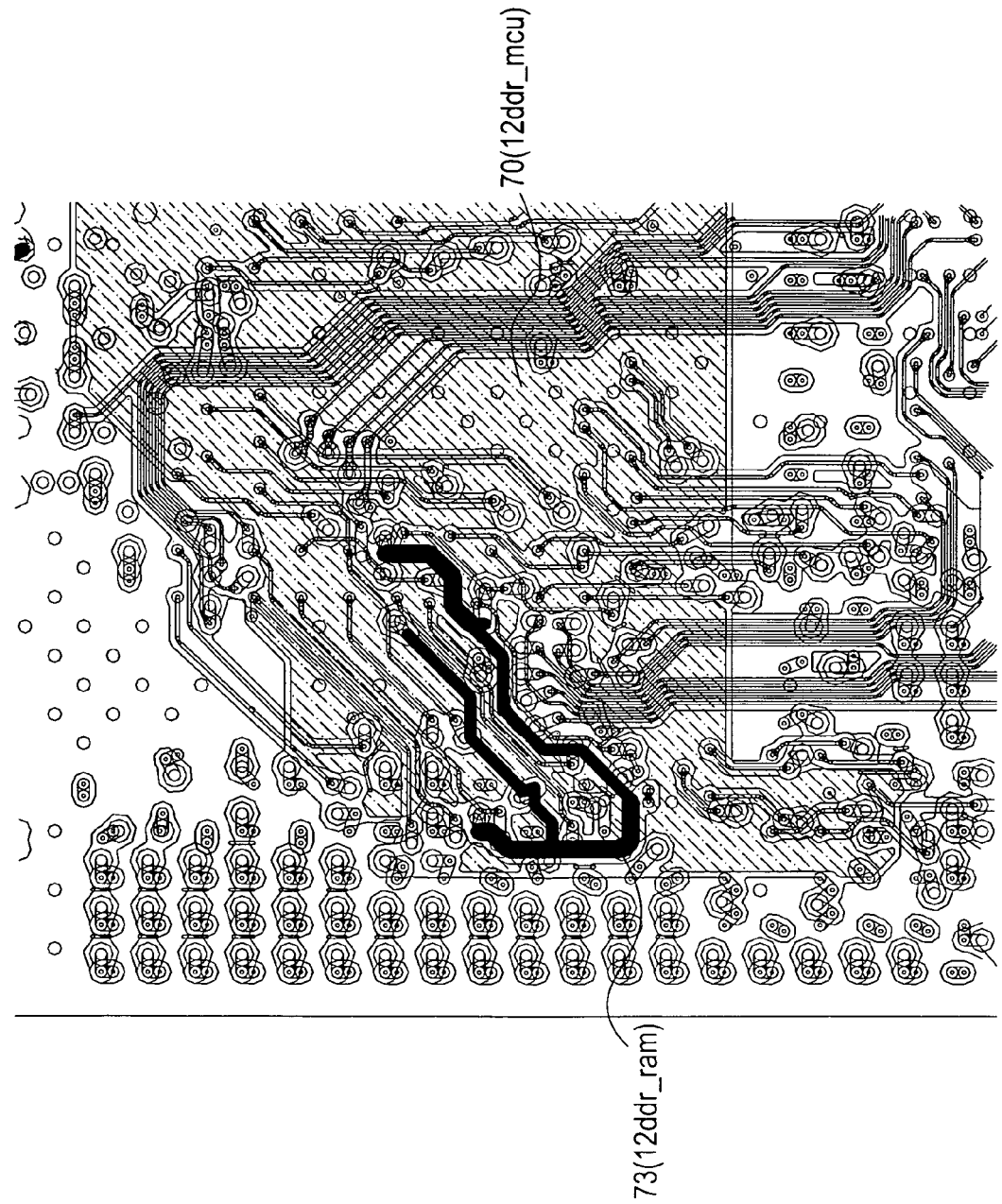
FIG. 18 is a plan view showing patterns obtained by superimposing patterns of the wiring layer L5 shown in FIG. 16 and patterns of the wiring layer L4 shown in FIG. 17.

A power wiring formed in the wiring layer L5 is shown in FIG. 16. Reference numeral 73 indicates a DDR-SDRAM power wiring connected to the DRAM power supply bump electrodes 12ddr_ram for DDR. FIG. 17 shows the wiring layer L4 placed over the wiring layer L5 of FIG. 16 at the position where it is superimposed over the wiring layer L5. A pattern obtained by superimposing a pattern of the wiring layer L5 shown in FIG. 16 and a pattern of the wiring layer L4 shown in FIG. 17 is shown in FIG. 18. As is apparent from the same figure, the DDR power plane 73 and the DDR power plane 70 have layouts superimposed on each other in an adjacent layer of the printed circuit board 2.

Figure 19:
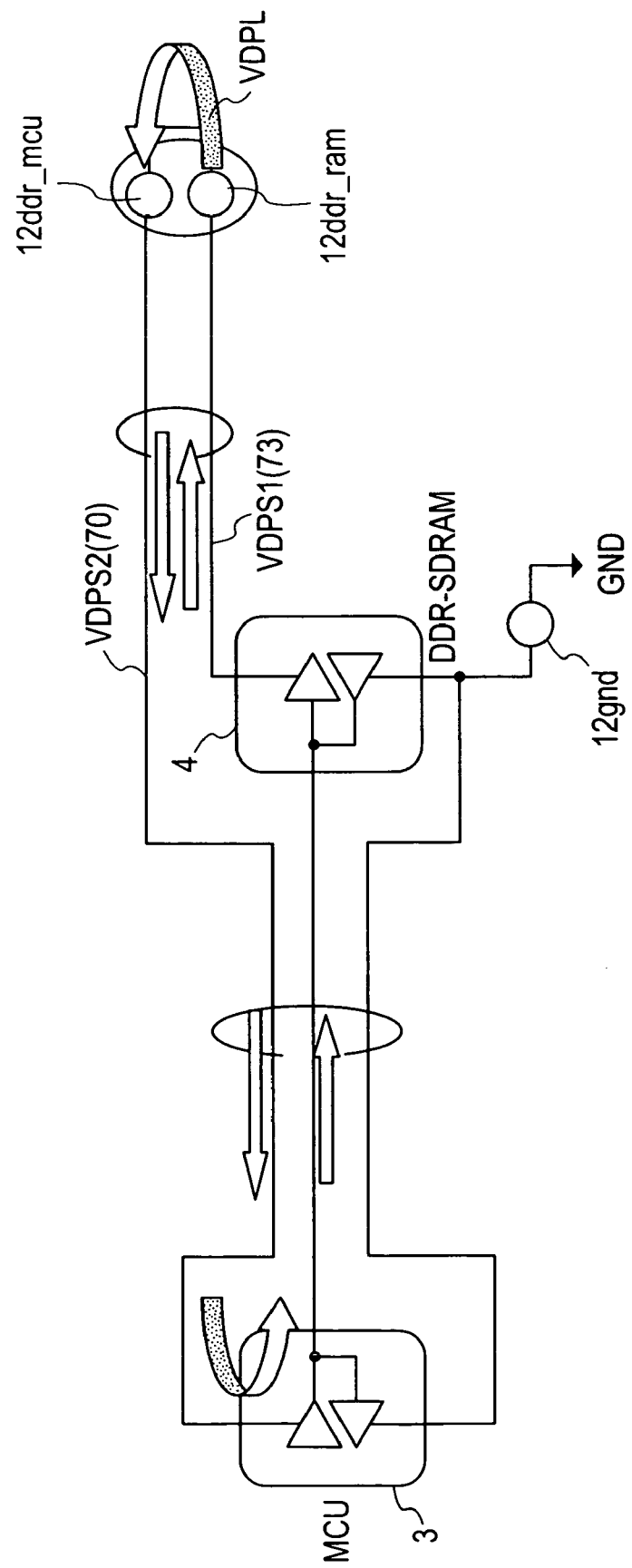
FIG. 19 is a typical diagram showing feedback current paths of a power system with changes in signals outputted from the MCU to the DDR-SDRAM.

Feedback current paths of a power system with changes in signals outputted from the MCU to DDR-SDRAM 4 are typically shown in FIG. 19. When the signals are charged and discharged between the MCU 3 and the DDR-SDRAM 4 where the DRAM power supply bump electrodes 12ddr_ram for DDR and the MCU power supply bump electrodes 12ddr_mcu for DDR are being separated from one another, paths VDPS1 and VDPS2 for feedback currents that flow through the power wrings, of their charge and discharge currents are partitioned by the corresponding DRAM power supply bump electrode 12ddr_ram for DDR and the corresponding MCU power supply bump electrode 12ddr_mcu on the semiconductor device 1 and must be fed back through the power wiring or power plane VDPL placed over the motherboard. This results in an increase in the impedance of the power system. In order to suppress it to the utmost, however, the power wiring 73 connected to the DRAM power supply bump electrodes 12ddr_ram for DDR and the power plane 70 connected to the MCU power supply bump electrodes 12ddr_mcu for DDR are formed in the discrete wiring layers and disposed so as to overlap each other. Thus, the direction of the current on the path VDPS2, which flows through the power plane 70 with the input/output of each signal between the MCU 3 and the DDR-SDRAM 4, and the direction of the current on the path VDPS1, which flows through the power wiring 73, are opposite to each other. Therefore, the effective inductance of the power system can be reduced by coupling the power plane 70 and the power wiring 73.

The DRAM power supply bump electrodes 12ddr_ram for DDR and the MCU power supply bump electrodes 12ddr_mcu for DDR are disposed so as to adjoin one another. Thus, the power-system paths on the motherboard, which connect the DRAM power supply bump electrodes 12ddr_ram for DDR and the MCU power supply bump electrodes 12ddr_mcu for DDR, can be shortened. Even in this respect, the inductance of the power system can be reduced.

The power supply plane 70 has such a layout as to be superimposed on the data signal wirings 30 and 31 connected to the DDR-SDRAMs 4 and 5 and the MCU 3, the signal wirings 32 and 33 for the data strobe signal and data mask signal, and the clock signal wiring 34 as viewed in the front/back-surface direction of the printed circuit board 2. The signal wirings 30 through 34 are of course superimposed even over the ground plane for the wiring layer L3. Thus, the signal wirings 30 through 34 necessary for memory control of the MCU 3 and the power plane 70 in the circuit necessary for the memory control are coupled to one another, and hence the effective inductance at the memory power plane 70 can be reduced. Since the DDR-SDRAMs 4 and 5 are high in operating frequency for the data and strobe signal in particular, a reduction in effective impedance is important from the viewpoint of prevention of a malfunction.

From the viewpoint of the single test on the DDR-SDRAMs 4 and 5 as described above, the DDR power plane 70 for the MCU 3 is placed in the position where it is superimposed on the signal wirings 30 through 34 for DDR control when the DRAM power supply bump electrodes 12ddr_ram for DDR and the MCU power supply bump electrodes 12ddr_mcu for DDR are separated from one another. Thus, both are coupled and hence the inductance of the DDR power system for the MCU 3 can be reduced. Further, the DRAM power supply bump electrodes 12drr_ram for DDR and the MCU power supply bump electrodes 12ddr_mcu for DRR are disposed adjacent to one another to make it possible to shorten the power-system paths on the motherboard, which connect both. Even in this respect, the inductance of the power system can be reduced. Since the feedback currents that flow through the DDR power plane 70 and the DDR power plane 73 are opposite in direction, both the DDR power planes are disposed so as to overlap each other, whereby they are coupled to each other. It is therefore possible to reduce the effective inductance of the DDR power system for each of the MCU 3 and DDR-SDRAMs 4 and 5.

<<Improvement in Signal Quality of Reference Potential>>

An SSTL_2 (Stub Series Terminated Logic for 2.5V) interface is normally used for the external interface of each DDR-SDRAM. In the SSTL_2, a stub resistor is inserted in series between a branch point (stub) of a signal from a bus and a memory to match between a transmission line and a device output. Further, a terminating voltage is terminated with the resistor to suppress reflection of a transmission system. In the semiconductor device 1 brought to multichip module form, as described up to now, the insertion of the stub resistor and external mounting of a terminating resistor may not be effected on most signal wirings for DDR interface. Reference potentials are used to detect high and low levels of an interface signal at the SSTL_2. As to this, the semiconductor device 1 is also the same.

A reference potential Vref used for the DDR interface circuit of the MCU 3, a reference potential Vref1 used for the DDR-SDRAM 4, and a reference potential Vref2 used for the DDR-SDRAM 5 are respectively supplied from the substrate bump electrodes 12 inherent therein. Such substrate bump electrodes are configured as reference potential terminals 12vref, 12vref1 and 12vref2 illustrated in FIG. 20. The reference potential terminals 12vref, 12vref1 and 12vref2 respectively have such layouts as to be superimposed on the memory power plane 70 as viewed in the front/back-surface direction of the printed circuit board 2. Executing customization of the reference potential terminals 12vref, 12vref1 and 12vref2 makes it possible to shorten routing of reference potential wirings inside the semiconductor device 1. In brief, the wiring length of each reference potential wiring can be shortened because since the reference potential terminals are associated with the MCU 3 and the DDR-SDRAMs 4 and 5 in a one-to-one relationship, the corresponding reference potential terminals can be disposed near the corresponding devices.

According to the specs of each DDR-SDRAM, the reference potentials Vref, Vref1 and Vref2 are respectively defined so as to have a level equal to one-half the DDR power supply of the memory power plane 70. Thus, the reference potential terminals 12vref, 12vref1 and 12vref2 are coupled to the memory power plane 70 so that the reference potentials Vref, Vref1 and Vref2 become hard to fluctuate or swing in level with respect to the DDR power supply.

Figure 20:
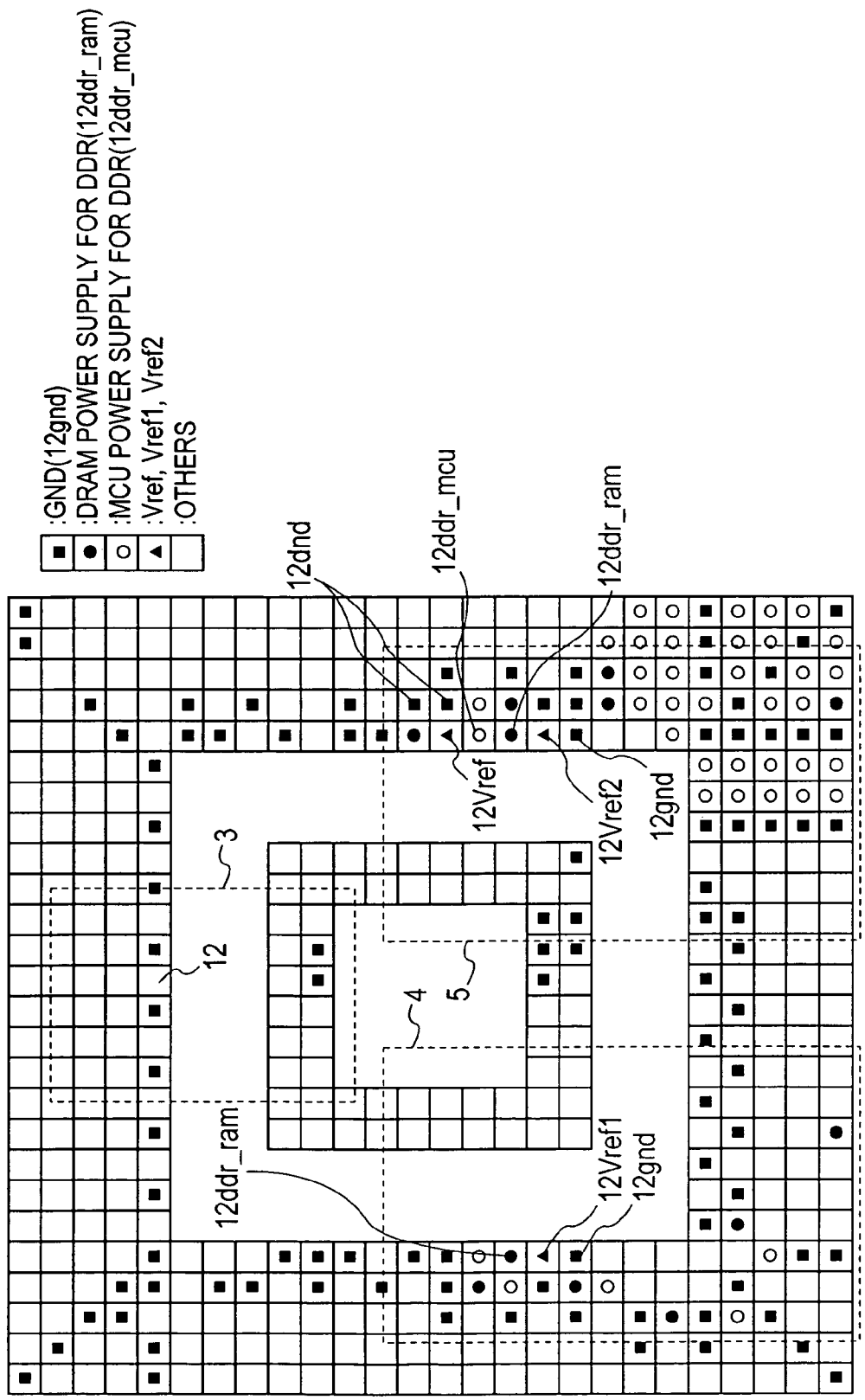
FIG. 20 is a plan view illustrating the layout of substrate bump electrodes dedicated to supply a reference potential employed in a DDR interface circuit of the MCU and a reference potential employed in the DDR-SDRAMs respectively.

As shown in FIG. 20, the reference potential terminal 12vref is adjacent to its corresponding DDR power supply bump electrode 12ddr_mcu and ground bump electrode 12gnd. Similarly, the reference potential terminals 12vref1 and 12vref2 are adjacent to their corresponding DDR power supply bump electrodes 12ddr_ram and ground bump electrodes 12gnd. Thus, since coupling among the reference potentials, power supply and ground can be obtained, unwanted fluctuations in reference potential can be suppressed.

As shown in FIG. 20, the reference potential terminals 12vref, 12vref1 and 12vref2 are placed in the innermost periphery of the outer peripheral substrate bump electrode group. Assuming that as mentioned above, the power supply bump electrodes 12io for external interface are dispersed into the outer peripheral bump electrode group together with the signal bump electrodes in conjunction with the ground bump electrodes 12gnd, and the DDR power supply bump electrodes 12ddr are disposed close to the DDR-SDRAMs 4 and 5, coupling among the reference potentials, power supply and ground is easy to obtain.

Figure 21:
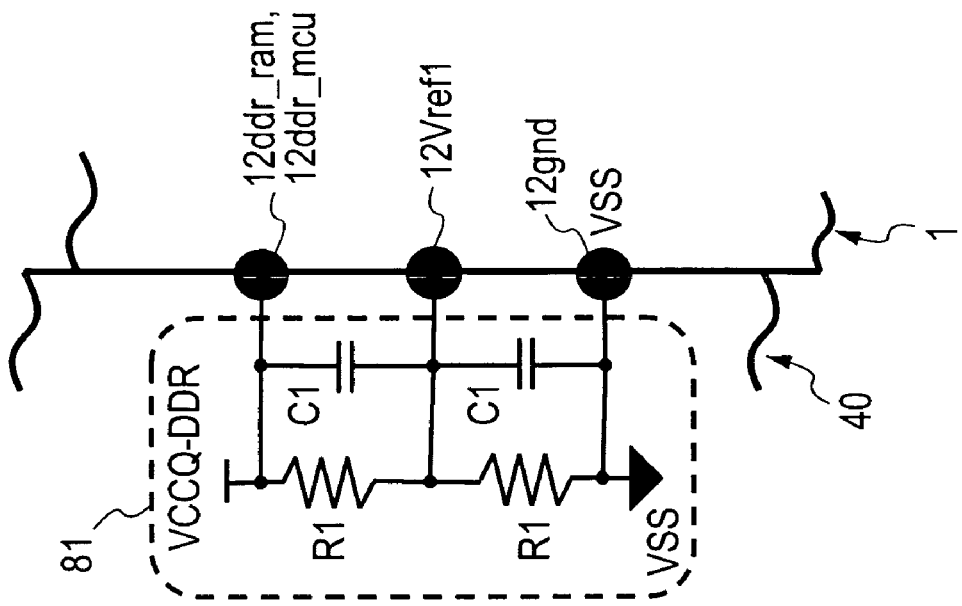
FIG. 21 is a circuit diagram illustrating a circuit for forming reference potentials Vref and Vref2, which is disposed over the motherboard.
Figure 22:
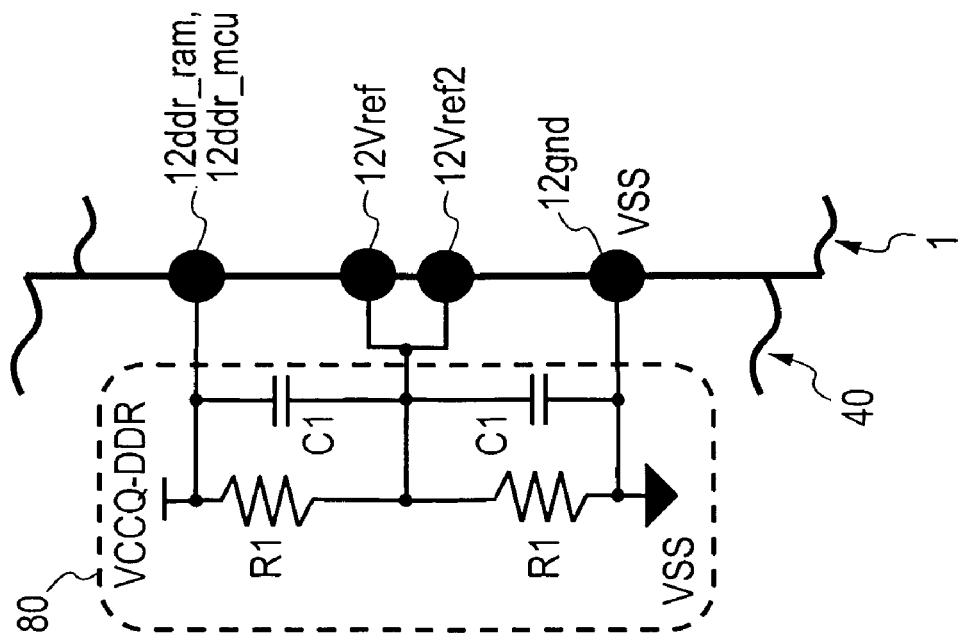
FIG. 22 is a circuit diagram illustrating a circuit for forming a reference potential Vref1, which is disposed over the motherboard.

A circuit for forming the reference potentials Vref and Vref2, which is disposed over the motherboard, is shown in FIG. 21, and a circuit for forming the reference potential Vref1, which is disposed over the motherboard, is shown in FIG. 22. The DDR DRAM power supply and the DDR MCU power supply are of the same voltage (e.g., 2.5V) and supplied commonly from the DDR power plane of the motherboard. VCCQ-DDRs in FIGS. 21 and 22 respectively correspond to a voltage (e.g., 2.5V) for the DDR power plane of the motherboard. Each of the reference potential forming circuits 80 and 81 is provided with a resistance divider which divides the DDR power supply voltage VCCQ-DDR into a level of ½ with respect to a ground potential GND through the use of resistors R1 and R2. C1 and C2 correspond to capacitors which cut RF noise. The reference potential forming circuit 80 forms the reference potentials Vref and Vref2 together. This is because the reference potential terminals 12vref and 12vref2 are disposed relatively close to each other. The reference potential forming circuit 81 is dedicated to forming the reference potential Vref1.

<<Suppression of Power Noise in DLL Circuit>>

Figure 23:
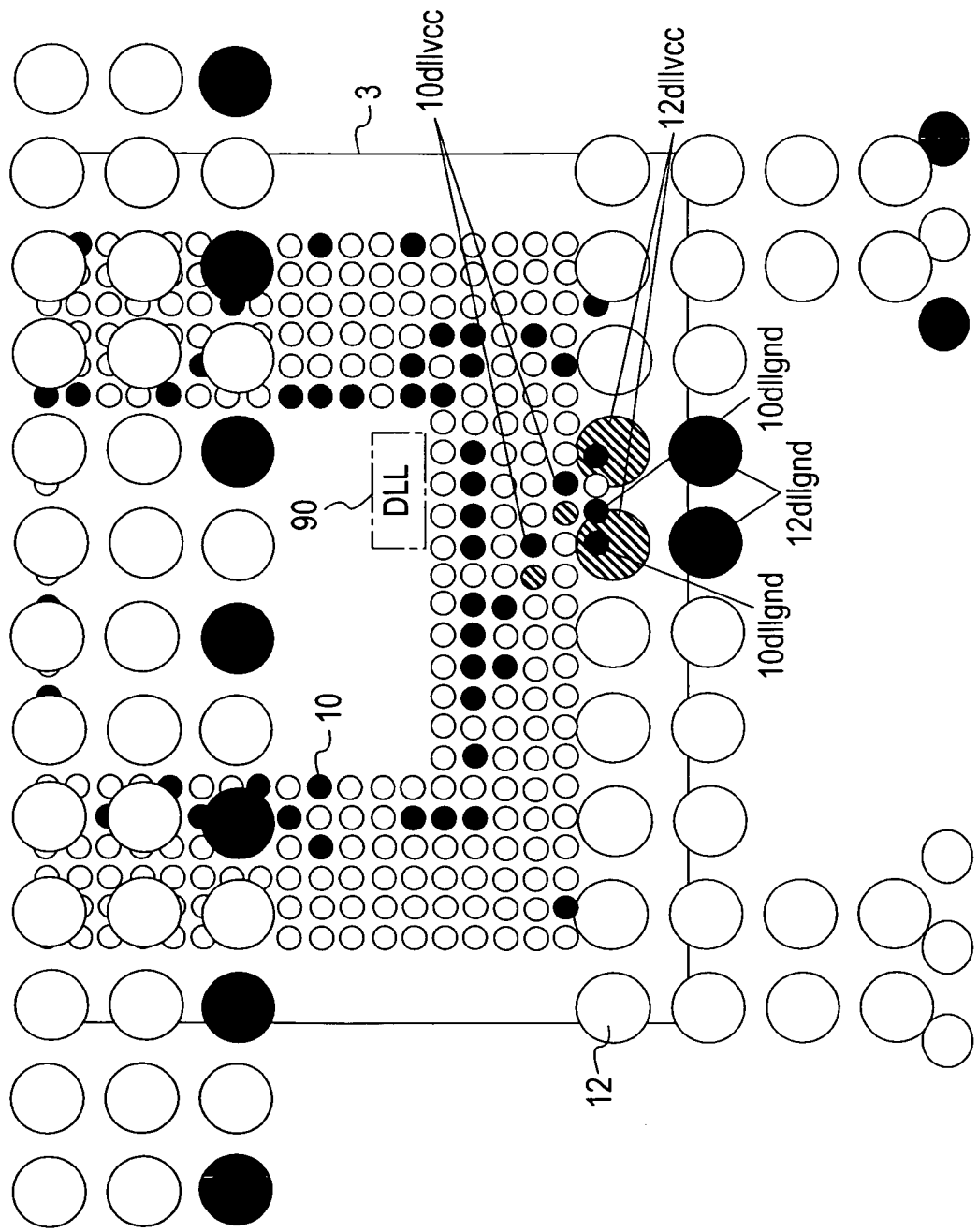
FIG. 23 is a plan view illustrating the layout of power supply terminals for a DLL circuit.

A layout of power supply terminals for a DLL circuit is illustrated in FIG. 23. FIG. 23 shows the manner in which part of the semiconductor device is seen through from above. In FIG. 23, small round graphic forms indicate device bump electrodes 10, and large round graphic forms indicate substrate bump electrodes 12. The clock generator of the MCU 3 is equipped with, for example, a DLL circuit 90. The MCU 3 has DLL device power supply bump electrodes 10dllvcc and DLL device ground bump electrodes 10dllgnd dedicated to the DLL circuit, as the device bump electrodes 10. The printed circuit board 2 has, as the substrate bump electrodes 12, DLL substrate power supply bump electrodes 12dllvcc and DLL substrate ground bump electrodes 12dllgnd dedicated to the DLL circuit.

Within a plane vertical to the front/back surface direction of the printed circuit board 2, the DLL substrate power supply bump electrodes 12dllvcc are disposed in the neighborhood of the DLL device power supply bump electrodes 10dllvcc, and the DLL substrate ground bump electrodes 12dllgnd are disposed in the vicinity of the DLL device ground bump electrodes 10dllgnd. From the above, power-system and ground-system wirings dedicated to the DLL circuit 90 in the semiconductor device 1 can be made the shortest. Currents that have flown from the corresponding dedicated power supply terminals 12dllvcc and 10dllvcc to the DLL circuit 90 are fed back to their corresponding dedicated ground terminals 10dllgnd and 12dllgnd. Therefore, if the power-system and ground-system wirings are rendered the shortest as described above, then the area of a loop that goes through the power and ground wirings dedicated to the DLL circuit 90 becomes small and hence noise becomes hard to enter into the power system dedicated to the DLL circuit 90. It is possible to prevent the fear of a malfunction of the DLL circuit 90 whose circuit characteristic is susceptible to power noise, before it happens.

Further, the power supply bump electrodes 12dllvcc and ground bump electrodes 12dllgnd of the printed circuit board 2 are made adjacent to one another. This is equivalent to the fact that the power supply bump electrodes 10dllvcc and ground bump electrodes 10dllgnd of the MCU 3 are rendered adjacent to one another. Thus, it becomes easy to form the pairs of the power wirings and ground wirings dedicated to the DLL circuit 90 so as to adjoin each other. Resistance to crosstalk noise is also improved.

<<Layout of Substrate Terminals for Testing>>

Figure 24:
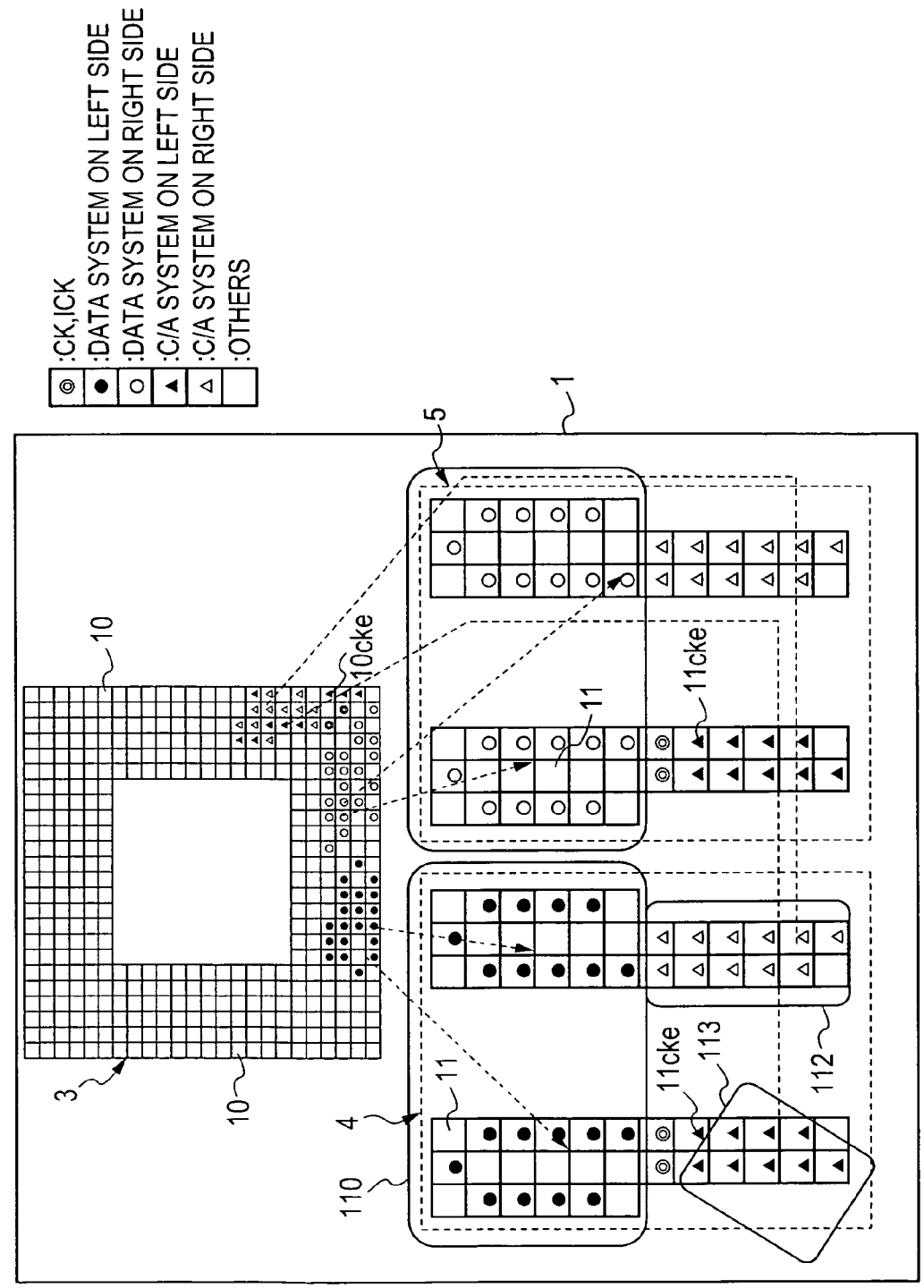
FIG. 24 is a plan view illustrating the layout of major device bump electrodes of DDR-SDRAMs and an MCU, which are mounted over a printed circuit board.

The layout of major device bump electrodes of DDR-SDRAMs 4 and 5 and an MCU 3, which are mounted over a printed circuit board 2, is illustrated in FIG. 24. The illustrated contents correspond to the layout of FIG. 2. Double round signs correspond to clock terminals CK and /CK respectively. Black round or circle signs respectively correspond to data-system terminals of DQ, UDQS, LDGS, UDM and LDM of the DDR-SDRAM 4. White-circle signs respectively correspond to data-system terminals of DQ, UDQS, LDGS, UDM and LDM of the DDR-SDRAM 5. Solid or filled-in triangular signs respectively correspond to address and CKE terminals corresponding to address/command (A/C)-system terminals placed on the left half sides of the DDR-SDRAMs 4 and 5. Open triangular signs respectively correspond to command and address terminals for /RAS, etc. corresponding to A/C terminals placed on the right half sides of the DDR-SDRAMs 4 and 5. 11cke indicate clock enable terminals in the DDR-SDRAMs 4 and 5, and 10cke indicates an output terminal for a clock enable terminal.

Figure 25:
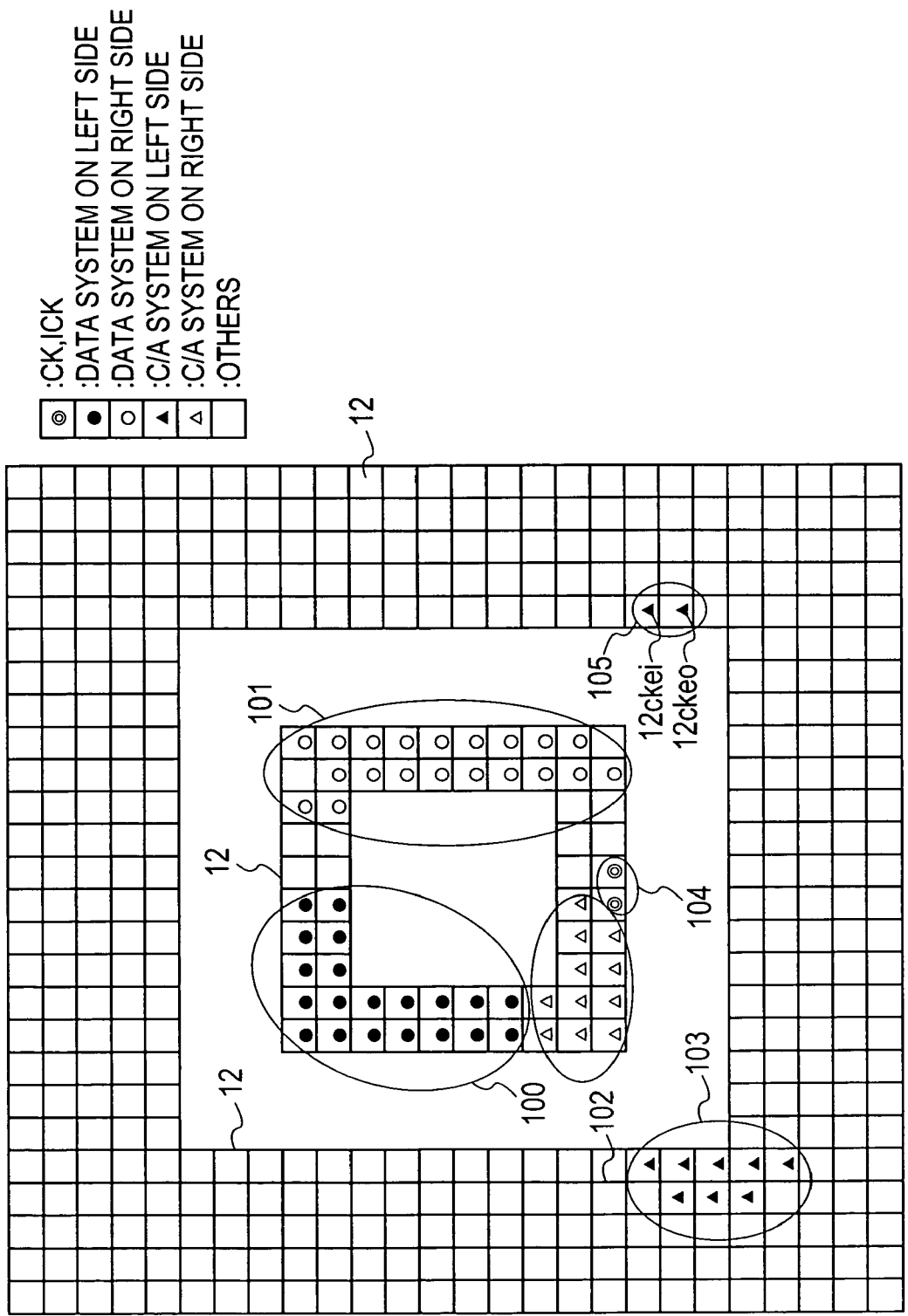
FIG. 25 is a plan view illustrating the assignment of testing terminals of each DDR-SDRAM with respect to substrate bump electrodes.

The assignment of testing terminals of each DDR-SDRAM with respect to substrate bump electrodes 12 is illustrated in FIG. 25. A fundamental connection form necessary for actual operations of an MCU 3 and DDR-SDRAMs 4 and 5 is as described based on FIG. 2 or the like. Terminals in areas indicated by reference numerals 100 to 105 correspond to the testing terminals of the DDR-SDRAMs. The meaning of signs such as double circles corresponds to FIG. 24. CK and /CK designated at double circle signs contained in the areas 102 through 104 and CA-system terminals indicated by triangular signs are commonly connected to their corresponding terminals of both the DDR-SDRAMs 4 and 5. Data-system terminals indicated by round signs contained in the area 101 are individually connected to their corresponding terminals of the DDR-SDRAMs 4 and 5. The testing terminals in the areas 100 through 105 are allocated to the substrate bump electrodes corresponding to some of the central substrate bump electrode group 12, of the bump electrodes 12, and the substrate bump electrodes corresponding to part on the inner peripheral side, of the outer peripheral substrate bump electrode group. Wiring patterns on the motherboard are formed so as to match with the array of the substrate bump electrodes 12 of the semiconductor device 1. Thus, the wiring patterns on the motherboard, which are connected to their corresponding substrate bump electrodes placed in the center of a printed circuit board 2, must be extended in avoidance of the wiring patterns on the motherboard, which are connected to their corresponding substrate bump electrodes placed on the outer peripheral side of the printed circuit board 2. Thus, the assignment of the test-dedicated terminals to the central side of the printed circuit board 2 can contribute to the simplification of a wiring structure on the motherboard, which is connected to the substrate bump electrodes of the semiconductor device.

The layout of the testing substrate bump electrodes is taken into particular consideration in such a manner that the wirings extending to their corresponding terminals become short and the testing terminals are gathered at the central portion of the substrate bump electrodes. That is, the A/C-system terminals indicated by the solid triangular signs of FIG. 24 are terminals commonly connected between the DDR-SDRAM 4 and the DDR-SDRAM 5 for the purpose of actual operations. At this time, the terminals in an area 113 on the DDR-SDRAM 4 side are connected to their corresponding substrate bump electrodes in the area 103 of FIG. 25 so as to function as test-dedicated terminals. As is apparent if FIGS. 24 and 25 are caused to overlap each other in their front and back surfaces, the area 113 and the area 103 respectively have layouts substantially superimposed on each other as viewed up and down. Similarly, the A/C-system terminals indicated by the open triangular signs of FIG. 24 are also terminals commonly connected between the DDR-SDRAM 4 and the DDR-SDRAM 5 for the purpose of actual operations. In regard to it, the terminals in an area 112 on the DDR-SDRAM 4 side are connected to their corresponding substrate bump electrodes in the area 102 of FIG. 25 so as to function as test-dedicated terminals. The area 112 and the area 102 are substantially adjacent to each other as viewed vertically. Terminals in an area 110 on the DDR-SDRAM 4 side are connected to their corresponding substrate bump electrodes in the area 100 of FIG. 25 so as to function as test-dedicated terminals. Terminals in an area 111 on the DDR-SDRAM 5 side are connected to their corresponding substrate bump electrodes in the area 101 of FIG. 25 so as to function as test-dedicated terminals.

The wirings extending to the testing substrate bump electrodes become short in this way. Thus, since wiring delivery among the wiring layers is reduced and crosses among respective wiring groups are reduced, the design of wirings extending to the test terminals on the printed circuit board becomes easy.

<Customization of Device Terminals for Clock Enable Signal>>

As shown in FIG. 24, each of the DDR-SDRAMs 4 and 5 has the input terminal 11cke for the clock enable signal for indicating the validity of a signal inputted to each of the clock input terminals CK and /CK, as one device bump electrode 11. The MCU 3 has the output terminal 10cke for outputting the clock enable signal, as one device bump electrode 10. As shown in FIG. 25, a test terminal 12ckei connected to the input terminal 11cke for the clock enable signal, and a test terminal 12ckeo connected to the output terminal 10cke for the clock enable signal are provided in several as the respective ones of the substrate bump electrodes 12. Thus, when the semiconductor device 1 is device-tested before its mounting onto the motherboard, a clock enable signal is supplied to its corresponding test terminal 12cke to thereby make it possible to effect a device test on each of the DDR-SDRAMs 4 and 5 without operating the MCU 3 at all. Upon testing, the clock enable signal to the terminal 12ckei is set to a disenable level to bring the DDR-SDRAMs 4 and 5 into a standby state or a not-ready state, thereby enabling a single test on the MCU 3.

With the adjacent placement of the test terminals 12ckei and 12ckeo, it becomes easy to connect both terminals separated for testing to each other on the motherboard for the purpose of the actual operations.

While the invention made above by the present inventors has been described specifically on the basis of the preferred embodiments, the present invention is not limited to the embodiments referred to above. It is needless to say that various changes can be made thereto within the scope not departing from the gist thereof.

For example, the number of parallel-data input/output bits of each DDR-SDRAM may be ×8 or ×4. The SDRAM may further be one equipped with a circuit format which performs data input/output at a clock rate equal to twice the DDR. The semiconductor memory device is not limited to the SDRAM and may be a synchronous SRAM. The semiconductor data processing device is not limited to the microcomputer. It may be a graphic controller, a controller which performs decoding/combining processing, or the like. A PLL circuit may be used as an alternative to the DLL circuit.

What is claimed is:

1. A semiconductor device comprising:
   a mounting board including a wiring layer, a main surface, and a back surface opposing to the main surface;
   a first semiconductor device including a first data input/output terminal, a first data strobe terminal, a first address input terminal and a first clock input terminal, and mounted over the main surface of the mounting board;
   a second semiconductor device including a second data input/output terminal, a second data strobe terminal, a second address input terminal and a second clock input terminal, and mounted over the main surface of the mounting board such that the second semiconductor device is arranged next to the first semiconductor device in a plane view;
   a third semiconductor device including a third data input/output terminal, a third data strobe terminal, a third address input terminal and a third clock input terminal, and mounted over the main surface of the mounting board such that the third semiconductor device is arranged next to the first and second semiconductor devices in a plane view; and
   a plurality of bump electrodes formed on the back surface of the mounting board;
   wherein the second semiconductor device is the same type of device as the first semiconductor device;
   wherein the first and second semiconductor devices are operated in sync with a clock signal;
   wherein the third semiconductor device accesses to each of the first and second semiconductor devices, and controls each of the first and second semiconductor devices;
   wherein the wiring layer includes a first wiring electrically connecting the third clock input terminal with each of the first and second clock input terminals; and
   wherein the first wiring is divided, at an area between the first and second semiconductor devices, into a first part connecting with the first clock input terminal and a second part connecting with the second clock input terminal.

2. The semiconductor device according to claim 1, wherein each of the first and second semiconductor devices is a synchronous DRAM having a double data rate.

3. The semiconductor device according to claim 2, wherein the first and second semiconductor devices are mounted over the mounting board such that the first and second data input/output terminals and the first and second data strobe terminals are arranged closer to the third semiconductor device than the first and second address input terminals, respectively;
   wherein the wiring layer includes a second wiring electrically connecting the first data strobe terminal with the third data strobe terminal, and a third wiring electrically connecting the second data strobe terminal with the third data strobe terminal; and
   wherein the second and third wirings are arranged between the first and second semiconductor devices in a plane view.

4. The semiconductor device according to claim 3, wherein the wiring layer includes a fourth wiring connecting with the first address input terminal and a fifth wiring connecting with the second address input terminal; and
   wherein each of the fourth and fifth wirings is formed to extend from one of the first and second semiconductor devices toward the other of the first and second semiconductor devices.

5. The semiconductor device according to claim 4, wherein the third semiconductor device includes at least one of a PLL circuit and a DLL circuit,
   wherein the third semiconductor device includes a power supply device terminal dedicated to the PLL circuit or the DLL circuit, and ground device terminal dedicated to the PLL circuit or the DLL circuit.

6. The semiconductor device according to claim 5, wherein the plurality of bump electrodes includes a core power supply terminal for supplying a core circuit power to the third semiconductor device, a power supply terminal for the mounting board dedicated to the PLL circuit or the DLL circuit, an interface power supply terminal for supplying an external interface power supply to the third semiconductor device, memory power supply terminals for supplying a memory power supply to the first, second and third semiconductor devices, and a ground terminal for the mounting board dedicated to the PLL circuit or the DLL circuit,
   wherein the core power supply terminals are disposed closer to the third semiconductor device than the memory power supply terminals,
   wherein the memory power supply terminals are disposed closer to the first and second semiconductor memory devices than the core power supply terminal, and
   wherein the interface power supply terminals are disposed around the mounting board together with signal terminals and the ground terminal.

7. The semiconductor device according to claim 1, wherein a point where the first wiring is divided into the first part and the second part is located so that the first part and the second part are substantially equal in length to one another.

8. The semiconductor device according to claim 2, wherein a point where the first wiring is divided into the first part and the second part is located so that the first part and the second part are substantially equal in length to one another.

9. The semiconductor device according to claim 3, wherein a point where the first wiring is divided into the first part and the second part is located so that the first part and the second part are substantially equal in length to one another.

10. The semiconductor device according to claim 4, wherein a point where the first wiring is divided into the first part and the second part is located so that the first part and the second part are substantially equal in length to one another.

11. The semiconductor device according to claim 5, wherein a point where the first wiring is divided into the first part and the second part is located so that the first part and the second part are substantially equal in length to one another.

12. The semiconductor device according to claim 6, wherein a point where the first wiring is divided into the first part and the second part is located so that the first part and the second part are substantially equal in length to one another.

* * * * *